United States Patent
Yagishita

(10) Patent No.: US 10,505,558 B2
(45) Date of Patent: Dec. 10, 2019

(54) ANALOG-TO-DIGITAL CONVERTER, ELECTRONIC DEVICE, AND METHOD OF CONTROLLING ANALOG-TO-DIGITAL CONVERTER

(71) Applicant: SONY CORPORATION, Tokyo (JP)

(72) Inventor: Yuki Yagishita, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 16/083,215

(22) PCT Filed: Dec. 28, 2016

(86) PCT No.: PCT/JP2016/089075
§ 371 (c)(1),
(2) Date: Sep. 7, 2018

(87) PCT Pub. No.: WO2017/158996
PCT Pub. Date: Sep. 21, 2017

(65) Prior Publication Data
US 2019/0068209 A1    Feb. 28, 2019

(30) Foreign Application Priority Data
Mar. 16, 2016  (JP) .................. 2016-051837

(51) Int. Cl.
*H03M 1/00* (2006.01)
*H03M 1/12* (2006.01)
(Continued)

(52) U.S. Cl.
CPC ........ *H03M 1/002* (2013.01); *H03K 19/0016* (2013.01); *H03M 1/12* (2013.01); *H03M 1/38* (2013.01)

(58) Field of Classification Search
CPC .......... H03M 1/002; H03M 1/12; H03M 1/38; H03K 19/0016
(Continued)

(56) References Cited

U.S. PATENT DOCUMENTS 5,684,487 A   11/1997 Timko
6,075,478 A    6/2000 Abe
(Continued)

FOREIGN PATENT DOCUMENTS

CN    1260639 A     7/2000
CN   102792594 A   11/2012
(Continued)

OTHER PUBLICATIONS

International Search Report and Written Opinion of PCT Application No. PCT/JP2016/089075, dated Mar. 28, 2017, 13 pages of English Translation and 10 pages of ISRWO.
(Continued)

*Primary Examiner* — Brian K Young
(74) *Attorney, Agent, or Firm* — Chip Law Group

(57) ABSTRACT

To reduce power consumption of an analog-to-digital converter in which a comparator is provided. An analog-to-digital converter includes a comparator and a mode control unit. The comparator is configured to generate a comparison result by comparing an analog signal to a threshold indicating a boundary of a predetermined range in a determination mode and convert the analog signal into a digital signal in a conversion mode. The mode control unit is configured to transition the determination mode to the conversion mode in a case in which the comparison result indicating that the analog signal is not within the predetermined range is generated.

16 Claims, 24 Drawing Sheets

(51) Int. Cl.
  *H03M 1/38* (2006.01)
  *H03K 19/00* (2006.01)
(58) Field of Classification Search
  USPC .......................................................... 341/155
  See application file for complete search history.

(56) References Cited

U.S. PATENT DOCUMENTS

| | | | |
|---|---|---|---|
| 6,433,727 | B1 | 8/2002 | Yoshinaga |
| 7,589,766 | B2 * | 9/2009 | Itani ..................... H04N 5/2352 |
| | | | 348/229.1 |
| 8,779,952 | B1 * | 7/2014 | Zortea ................. H03M 1/1004 |
| | | | 341/118 |
| 9,680,492 | B1 * | 6/2017 | Farley ................. H03M 1/0863 |
| 10,135,453 | B2 * | 11/2018 | Hernes ................. H03M 1/002 |
| 2007/0115159 | A1 | 5/2007 | Tachibana et al. |
| 2012/0319880 | A1 | 12/2012 | Matsumoto et al. |

FOREIGN PATENT DOCUMENTS

| | | |
|---|---|---|
| EP | 1018806 A2 | 7/2000 |
| JP | 08-28663 B2 | 3/1996 |
| JP | 08-028663 B2 | 3/1996 |
| JP | 10-303751 A | 11/1998 |
| JP | 11-506883 A | 6/1999 |
| JP | 2000-201077 A | 7/2000 |
| JP | 2007-142863 A | 6/2007 |
| WO | 96/39747 A1 | 12/1996 |
| WO | 2011/111127 A1 | 9/2011 |

OTHER PUBLICATIONS

International Preliminary Report on Patentability of PCT Application No. PCT/JP2016/089075, dated Sep. 27, 2018, 13 pages of English Translation and 8 pages of IPRP.

* cited by examiner

| MODE SIGNAL MODE | OPERATION OF SAMPLING SWITCH CONTROL UNIT |
|---|---|
| 0 (VOLTAGE RANGE DETERMINATION MODE) | TURN POSITIVE-SIDE SWITCH ON AND TURN NEGATIVE-SIDE SWITCH OFF |
| 1 (AD CONVERSION MODE) | TURN POSITIVE-SIDE AND NEGATIVE-SIDE SWITCHES ON WHEN SAMPLING CLOCK IS AT HIGH LEVEL |

FIG. 5

| MODE SIGNAL MODE | OPERATION OF SELECTION UNIT |
|---|---|
| 0<br>(VOLTAGE RANGE<br>DETERMINATION MODE) | SELECT AND OUTPUT<br>THRESHOLD $D_{th}$ |
| 1<br>(AD CONVERSION MODE) | SELECT AND OUTPUT<br>NEGATIVE-SIDE<br>CONTROL SIGNAL $DAC_n$ |

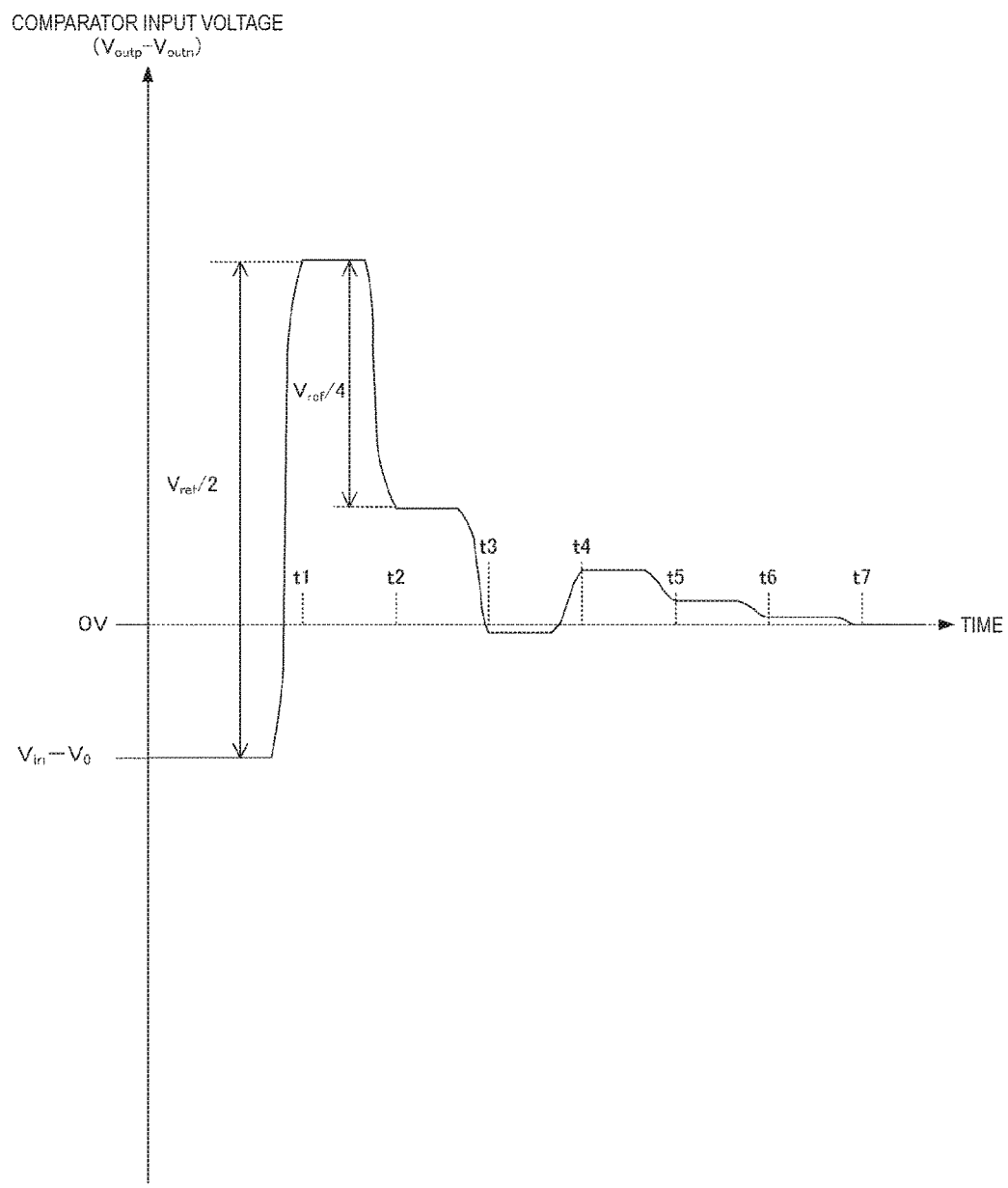

FIG. 7

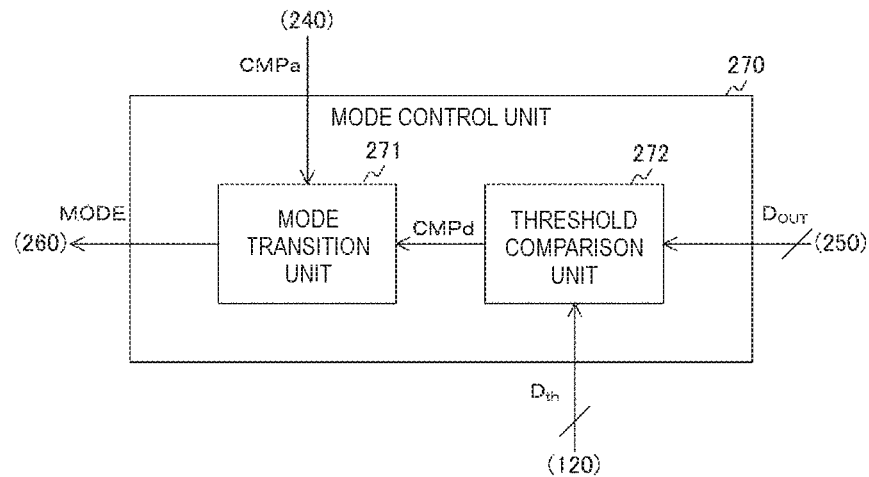

FIG. 8

| MODE SIGNAL MODE | COMPARISON RESULT CMPa OF ANALOG SIGNAL | COMPARISON RESULT CMPd OF DIGITAL SIGNAL | OPERATION OF MODE TRANSITION UNIT |
|---|---|---|---|
| 0 (VOLTAGE RANGE DETERMINATION MODE) | 0 (INPUT VOLTAGE > THRESHOLD) | — | TRANSITION MODE SIGNAL MODE TO "1" BECAUSE OF BEING WITHIN SETTING RANGE |
| | 1 (INPUT VOLTAGE ≤ THRESHOLD) | — | — |
| 1 (AD CONVERSION MODE) | — | 0 (INPUT VOLTAGE > THRESHOLD) | — |
| | — | 1 (INPUT VOLTAGE ≤ THRESHOLD) | TRANSITION MODE SIGNAL MODE TO "0" BECAUSE OF BEING OUTSIDE OF SETTING RANGE |

| MODE SIGNAL MODE | OPERATION OF SELECTION UNIT |
|---|---|
| 0 (LOWER-LIMIT DETERMINATION MODE) | SELECT AND OUTPUT LOWER-LIMIT $D_{thL}$ |
| 1 (UPPER-LIMIT DETERMINATION MODE) | SELECT AND OUTPUT UPPER-LIMIT $D_{thU}$ |
| 2 (AD CONVERSION MODE) | SELECT AND OUTPUT NEGATIVE-SIDE CONTROL SIGNAL $DAC_n$ |

FIG. 14

| MODE SIGNAL MODE | COMPARISON RESULT CMPa OF ANALOG SIGNAL | COMPARISON RESULT CMPd OF DIGITAL SIGNAL | OPERATION OF MODE TRANSITION UNIT |
|---|---|---|---|
| 0 (LOWER-LIMIT DETERMINATION MODE) | 0 (INPUT VOLTAGE > LOWER LIMIT) | — | INTERNAL FLAG IS ON |
| | 1 (INPUT VOLTAGE ≤ LOWER LIMIT) | — | — |
| 1 (UPPER-LIMIT DETERMINATION MODE) | 0 (INPUT VOLTAGE > UPPER LIMIT) | — | — |
| | 1 (INPUT VOLTAGE ≤ UPPER LIMIT) | — | TRANSITION MODE SIGNAL MODE TO "2" WHEN INTERNAL FLAG IS ON |
| 2 (AD CONVERSION MODE) | — | 0 (WITHIN SETTING RANGE) | — |
| | — | 1 (OUTSIDE OF SETTING RANGE) | TRANSITION MODE SIGNAL MODE TO "0" BECAUSE OF BEING OUTSIDE OF SETTING RANGE |

FIG. 18

| MODE SIGNAL MODE | SAMPLING CLOCK CLK$_{SMP}$ | OPERATION OF SELECTION UNIT |
|---|---|---|
| 0<br>(VOLTAGE RANGE DETERMINATION MODE) | 0 | SELECT AND OUTPUT THRESHOLD D$_{th}$ |
| | 1 | STOP OUTPUT |
| 1<br>(AD CONVERSION MODE) | 0/1 | SELECT AND OUTPUT NEGATIVE-SIDE CONTROL SIGNAL DACn |

FIG. 20

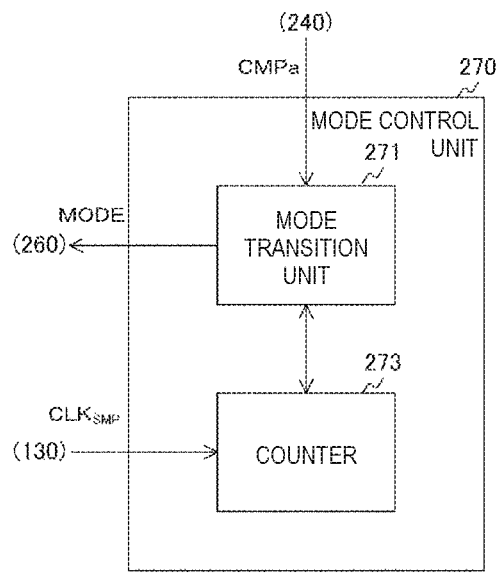

FIG. 21

| MODE SIGNAL MODE | COMPARISON RESULT CMPa OF ANALOG SIGNAL | OPERATION OF MODE TRANSITION UNIT |
|---|---|---|
| 0 (VOLTAGE RANGE DETERMINATION MODE) | 0 (INPUT VOLTAGE > THRESHOLD) | TRANSITION MODE SIGNAL MODE TO "1" BECAUSE OF BEING WITHIN SETTING RANGE |
| | 1 (INPUT VOLTAGE ≤ THRESHOLD) | --- |
| 1 (AD CONVERSION MODE) | 0/1 | TRANSITION MODE SIGNAL MODE TO "0" WHEN NUMBER OF AD CONVERSIONS IS GREATER THAN GIVEN NUMBER OF TIMES |

FIG. 24

| MODE SIGNAL MODE | OPERATION OF SAMPLING SWITCH CONTROL UNIT |
|---|---|
| 0 (VOLTAGE RANGE DETERMINATION MODE) | TURN POSITIVE-SIDE AND NEGATIVE-SIDE SWITCHES ON WHEN SAMPLING CLOCK IS AT HIGH LEVEL |
| 1 (AD CONVERSION MODE) | TURN POSITIVE-SIDE AND NEGATIVE-SIDE SWITCHES ON WHEN SAMPLING CLOCK IS AT HIGH LEVEL |

FIG. 28

| MODE SIGNAL MODE | COMPARISON RESULT CMPa OF ANALOG SIGNAL | COMPARISON RESULT CMPd OF DIGITAL SIGNAL | OPERATION OF MODE TRANSITION UNIT |
|---|---|---|---|
| 0 (VOLTAGE RANGE DETERMINATION MODE) | 0 (INPUT VOLTAGE > THRESHOLD) | — | SET OSC_EN TO "1" AND TRANSITION MODE SIGNAL MODE TO "1" AFTER GIVEN PERIOD PASSES |
| | 1 (INPUT VOLTAGE ≤ THRESHOLD) | — | — |
| 1 (AD CONVERSION MODE) | — | 0 (INPUT VOLTAGE > THRESHOLD) | — |
| | — | 1 (INPUT VOLTAGE ≤ THRESHOLD) | SET OSC_EN TO "0" AND TRANSITION MODE SIGNAL MODE TO "0" |

FIG. 29

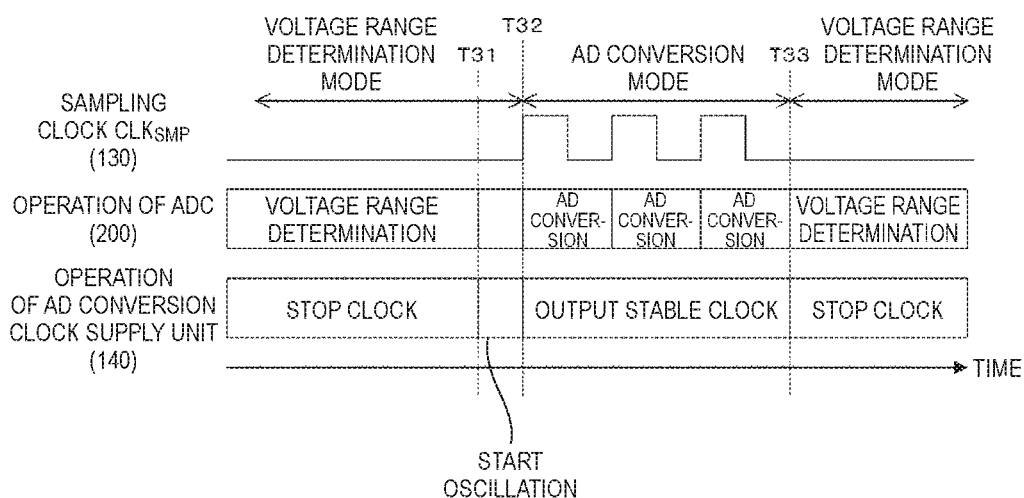

ANALOG-TO-DIGITAL CONVERTER, ELECTRONIC DEVICE, AND METHOD OF CONTROLLING ANALOG-TO-DIGITAL CONVERTER

CROSS REFERENCE TO RELATED APPLICATIONS

This application is a U.S. National Phase of International Patent Application No. PCT/JP2016/089075 filed on Dec. 28, 2016, which claims priority benefit of Japanese Patent Application No. JP 2016-051837 filed in the Japan Patent Office on Mar. 16, 2016. Each of the above-referenced applications is hereby incorporated herein by reference in its entirety.

TECHNICAL FIELD

The present technology relates to an analog-to-digital converter, an electronic device, and a method of controlling the analog-to-digital converter. Specifically, the present technology relates to an analog-to-digital converter including a comparator, an electronic device, and a method of controlling the analog-to-digital converter.

BACKGROUND ART

In the related art, in various electronic devices performing measurement or wireless communication, analog-to-digital converters (ADCs) are installed to convert analog signals from sensors or antennas into digital signals. There are various kinds of ADCs, and sequential comparison ADCs are widely used because of their low power consumption and small circuit scales. The sequential comparison ADC generally includes a comparator that compares a sampled analog signal to a reference voltage, a reference voltage generation circuit that generates the reference voltage, and a control circuit that controls the reference voltage in accordance with an output of the comparator (for example, see Patent Literature 1). In this configuration, the analog signal is converted into a digital signal with a plurality of bits and the bits are generated in order.

CITATION LIST

Patent Literature

Patent Literature 1: JP H08-28663B

DISCLOSURE OF INVENTION

Technical Problem

In the above-described technology of the related art, however, since bits are generated in order, a time from start of sampling to end of AD conversion increases with an increase in the number of bits of a digital signal, and thus power consumption may increase. When a sampling rate or the number of bits of a digital signal is decreased, power consumption can be reduced. However, since a data rate of the digital signal decreases, it is not preferable. In this way, there is a problem that it is difficult to reduce power consumption of an analog-to-digital converter without deteriorating performance.

The present technology is devised in view of such circumstances and an object of the present technology is to reduce power consumption of an analog-to-digital converter in which a comparator is provided.

Solution to Problem

The present technology is made in view of the above problem. A first aspect of the present technology is an analog-to-digital converter and a method of controlling the analog-to-digital converter, the analog-to-digital converter including: a comparator configured to generate a comparison result by comparing an analog signal to a threshold indicating a boundary of a predetermined range in a determination mode and convert the analog signal into a digital signal in a conversion mode; and a mode control unit configured to transition the determination mode to the conversion mode in a case in which the comparison result indicating that the analog signal is not within the predetermined range is generated. Thus, it is possible to obtain an operational effect of converting the analog signal into the digital signal in a case in which the comparison result indicating that the analog signal is not within the predetermined range is generated.

In addition, in the first aspect, a digital-to-analog conversion unit configured to generate a positive-side output signal and a negative-side output signal from the analog signal and a predetermined selection signal and output the positive-side output signal and the negative-side output signal to the comparator; a sequential comparison control unit configured to generate a predetermined control signal on a basis of the digital signal in the conversion mode; and a selection unit configured to select the predetermined threshold and supply the predetermined threshold as the predetermined selection signal to the digital-to-analog conversion unit in the conversion mode and to select the predetermined control signal and supply the predetermined control signal as the predetermined selection signal to the digital-to-analog conversion unit in the determination mode may be included. The comparator may compare the positive-side output signal to the negative-side output signal. Thus, it is possible to obtain an operational effect of selecting the predetermined threshold in the conversion mode and selecting the predetermined control signal in the determination mode.

In addition, in the first aspect, the analog signal may be a differential signal, the predetermined control signal may include a positive-side control signal and a negative-side control signal, the threshold may include a positive-side threshold and a negative-side threshold, and the selection unit may include a positive-side selection unit configured to select the positive-side threshold in the conversion mode and select the positive-side control signal in the determination mode, and a negative-side selection unit configured to select the negative-side threshold in the conversion mode and select the negative-side control signal in the determination mode. Thus, it is possible to obtain an operational effect of converting the differential signal into the digital signal.

In addition, in the first aspect, the analog signal may be a single end signal, the predetermined control signal may include a positive-side control signal and a negative-side control signal, the selection unit may supply one of the positive-side control signal and the negative-side control signal as the selection signal in the conversion mode, and the digital-to-analog conversion unit may generate the positive-side output signal and the negative-side output signal from the analog signal, the predetermined selection signal, and the other of the positive-side control signal and the negative-side control signal. Thus, it is possible to obtain an operational effect of converting the single end signal into the digital signal.

In addition, in the first aspect, the threshold may include an upper limit and a lower limit of the predetermined range, and the selection unit may select the upper limit and the lower limit in order in the determination mode. Thus, it is possible to obtain an operational effect of selecting the upper limit and the lower limit in order in the determination mode.

In addition, in the first aspect, the comparison control unit may generate the predetermined control signal in synchronization with a predetermined conversion clock signal from a conversion clock supply unit, and the determination unit may control the conversion clock supply unit in the determination mode such that generation of the predetermined conversion clock is started, and then transition the determination mode to the conversion mode. Thus, it is possible to obtain an operational effect of starting generation of the conversion clock in the determination mode and then transitioning the determination mode to the conversion mode.

In addition, in the first aspect, the mode control unit may determine whether the digital signal is within the predetermined range in the conversion mode and transition the conversion mode to the determination mode in a case in which the digital signal is not within the predetermined range. Thus, it is possible to obtain an operational effect of transitioning the conversion mode to the determination mode in the case in which the digital signal is not within the predetermined range.

In addition, in the first aspect, the mode control unit may count a number of times the analog signal is converted into the digital signal in the conversion mode and transition the conversion mode to the determination mode in a case in which a count value is greater than a predetermined value. Thus, it is possible to obtain an operational effect of transitioning the conversion mode to the determination mode in the case in which the number of times the analog signal is converted into the digital signal is greater than the predetermined value.

In addition, a second aspect of the present technology is an electronic device including: a sampling switch configured to sample an analog signal; a comparator configured to generate a comparison result by comparing the analog signal to a threshold indicating a boundary of the predetermined range in a determination mode and convert the sampled analog signal into a digital signal in a conversion mode; and a mode control unit configured to transition the determination mode to the conversion mode in a case in which the comparison result indicating that the analog signal is not within the predetermined range is generated. Thus, it is possible to obtain an operational effect of converting the sampled analog signal into the digital signal in the case in which the comparison result indicating that the analog signal is not within the predetermined range is generated.

In addition, in the second aspect, a clock signal supply unit configured to supply a clock signal may be further included. At least one of the sampling switch and the comparator may operate in synchronization with the clock signal, and the mode control unit may control the clock signal supply unit in the determination mode such that the supply of the clock signal is stopped. Thus, it is possible to obtain an operational effect of stopping supply of the clock signal in the determination mode.

In addition, in the second aspect, the clock signal may include a sampling clock signal, the sampling switch may sample the analog signal in synchronization with the sampling clock signal, and the mode control unit may cause the supply of the sampling clock signal to be stopped in the determination mode. Thus, it is possible to obtain an operational effect of stopping supply of the sampling clock signal in the determination mode.

In addition, in the second aspect, the clock signal may include an AD conversion clock signal, the comparator may convert the analog signal into the digital signal in synchronization with the AD conversion clock signal, and the mode control unit may cause the supply of the AD conversion clock signal to be stopped when transitioning the mode to the determination mode. Thus, it is possible to obtain an operational effect of stopping supply of the AD conversion clock signal when the conversion mode transitions to the determination mode.

In addition, in the second aspect, the mode control unit may cause the supply of the AD conversion clock signal to be started earlier by a predetermined time than when transitioning the determination mode to the conversion mode. Thus, it is possible to obtain an operational effect of starting supply of the AD conversion clock signal earlier by the predetermined time than when the determination mode transitions to the conversion mode.

Advantageous Effects of Invention

According to the present technology, it is possible to obtain the excellent advantageous effect of reducing power consumption of the analog-to-digital converter in which the comparator is provided. Note that effects described herein are not necessarily limitative, and any effect described in the present disclosure may be admitted.

BRIEF DESCRIPTION OF DRAWINGS

FIG. 5 is a diagram illustrating an example of an operation of the selection unit according to the first embodiment of the present technology.

FIG. 6 is a graph illustrating an example of a variation in a comparator input voltage according to the first embodiment of the present technology.

FIG. 7 is a block diagram illustrating a configuration example of a mode control unit according to the first embodiment of the present technology.

FIG. 8 is a diagram illustrating an example of an operation of a mode transition unit according to the first embodiment of the present technology.

FIG. 14 is a diagram illustrating an example of an operation of a mode transition unit according to the first modification example of the first embodiment of the present technology.

FIG. 18 is a diagram illustrating an example of an operation of a selection unit according to the second modification example of the first embodiment of the present technology.

FIG. 20 is a diagram illustrating a configuration example of a mode control unit according to a third modification example of the first embodiment of the present technology.

FIG. 21 is a diagram illustrating an example of an operation of the mode transition unit according to the third modification example of the first embodiment of the present technology.

FIG. 24 is a diagram illustrating an example of an operation of a sampling switch control unit according to a second embodiment of the present technology.

FIG. 28 is a diagram illustrating an example of an operation of a mode transition unit according to a third embodiment of the present technology.

FIG. 29 is a timing chart illustrating an example of an operation of the analog-to-digital converter according to the third embodiment of the present technology.

MODE(S) FOR CARRYING OUT THE INVENTION

Hereinafter, modes for carrying out the present technology (hereinafter referred to as embodiments) will be described. The description will be made in the following order.

1. First embodiment (example in which AD conversion is performed when analog signal is determined to be within setting range)
2. Second embodiment (example in which AD conversion is performed when differential analog signal is determined to be within setting range)
3. Third embodiment (example in which AD conversion is performed using clock signal when analog signal is determined to be within setting range)

<1. First Embodiment>

[Configuration Example of Electronic Device]

Figure 1:
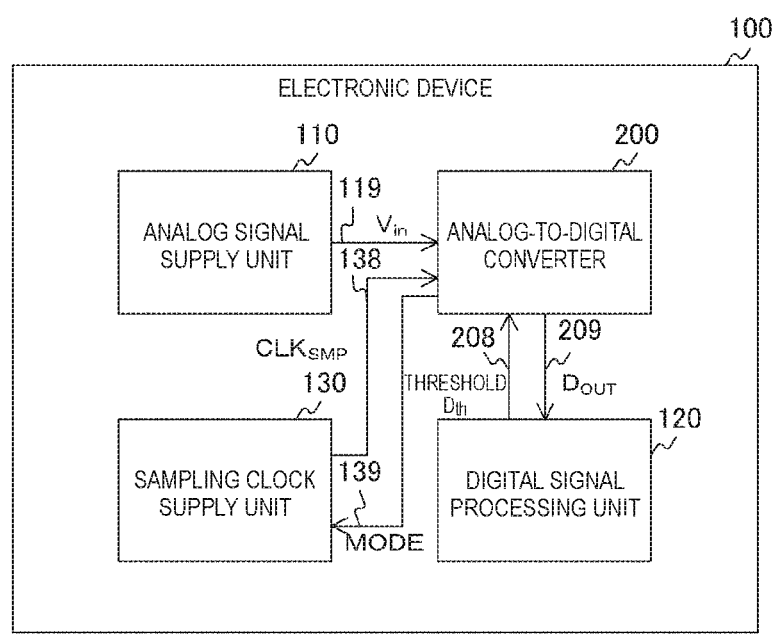
FIG. 1 is a block diagram illustrating a configuration example of an electronic device according to a first embodiment of the present technology.

FIG. 1 is a block diagram illustrating a configuration example of an electronic device 100 according to a first embodiment of the present technology. The electronic device 100 is a device that processes a digital signal and is assumed to be, for example, an environment monitor device, a digital health device, or a wireless communication device. The electronic device 100 includes an analog signal supply unit 110, a sampling clock supply unit 130, an analog-to-digital converter 200, and a digital signal processing unit 120.

The analog signal supply unit 110 supplies an analog input voltage $V_{in}$ to the analog-to-digital converter 200 via a signal line 119. The analog signal ($V_{in}$) is, for example, a single end signal. As the analog signal supply unit 110, for example, a sensor, such as a temperature sensor, a humidity sensor, and a pressure sensor, or an antenna is assumed. Note that the analog signal supply unit 110 may supply a current as an analog signal instead of a voltage.

The analog-to-digital converter 200 samples an analog input voltage $V_{in}$ in synchronization with a sampling clock $CLK_{SMP}$ and converts the analog input voltage $V_{in}$ into a digital signal $D_{out}$. Then, the analog-to-digital converter 200 supplies the digital signal $D_{out}$ to the digital signal processing unit 120 via a signal line 209.

In the analog-to-digital converter 200, a threshold $D_{th}$ is set in advance by the digital signal processing unit 120. The threshold $D_{th}$ indicates a boundary value (an upper limit or a lower limit) of a setting range which is a range of signals which are processing targets of the digital signal processing unit 120. The setting range is set within an input range in which an analog signal can be converted into a digital signal, in accordance with characteristics of the analog signal supply unit 110 or content processed by the digital signal processing unit 120. For example, in a case in which the analog signal supply unit 110 is used as a sensor and a signal with a level equal to or less than a certain lower limit is excluded as an abnormal value of a processing target because of characteristics of the sensor, a range exceeding the lower limit is set as the setting range.

In addition, the analog-to-digital converter 200 generates a mode signal MODE and supplies the mode signal MODE to the sampling clock supply unit 130 via a signal line 139. The mode signal MODE is a 1-bit signal indicating that a mode of the analog-to-digital converter 200 is one of a voltage range determination mode and an analog-to-digital (AD) conversion mode. In an initial state, for example, the voltage range determination mode is set. Here, the voltage range determination mode is a mode in which the analog-to-digital converter 200 determines whether the input voltage $V_{in}$ is within the setting range. On the other hand, the AD conversion mode is a mode in which the analog-to-digital converter 200 performs AD conversion. In the voltage range determination mode, the analog-to-digital converter 200 stops an AD conversion operation and determines whether the input voltage $V_{in}$ is within the setting range. Then, when the analog-to-digital converter 200 determines that the input voltage $V_{in}$ is within the setting range, the mode transitions to the AD conversion mode.

On the other hand, in the AD conversion mode, the analog-to-digital converter 200 samples the input voltage $V_{in}$ and converts the input voltage $V_{in}$ into the digital signal $D_{out}$. Then, the analog-to-digital converter 200 determines whether the digital signal $D_{out}$ is within the setting range for each AD conversion. Then, when the analog-to-digital converter 200 determines that the digital signal $D_{out}$ is within the setting range, the mode transitions to the voltage range determination mode.

The digital signal processing unit 120 performs a predetermined process on the digital signal $D_{out}$ which is within the setting range. The process to be performed is environment monitoring, a wireless communication process, or the like using a value measured by a temperature sensor, a humidity sensor, a pressure sensor, or the like. In addition, the digital signal processing unit 120 sets the threshold $D_{th}$ in advance before the AD conversion and supplies the threshold $D_{th}$ to the analog-to-digital converter 200 via a signal line 208.

The sampling clock supply unit 130 generates a period signal with a predetermined frequency as the sampling clock $CLK_{SMP}$ and supplies the sampling clock $CLK_{SMP}$ to the analog-to-digital converter 200 via a signal line 138. The sampling clock supply unit 130 supplies the sampling clock $CLK_{SMP}$ in the AD conversion mode and stops supplying the sampling clock $CLK_{SMP}$ in the voltage range determination mode.

Note that the analog-to-digital converter 200 may supply an enable signal to the sampling clock supply unit 130 instead of the mode signal MODE. In this case, disabling is set in the voltage range determination mode and enabling is set in the AD conversion mode.

[Configuration Example of Analog-to-Digital Converter]

Figures 2, 3:
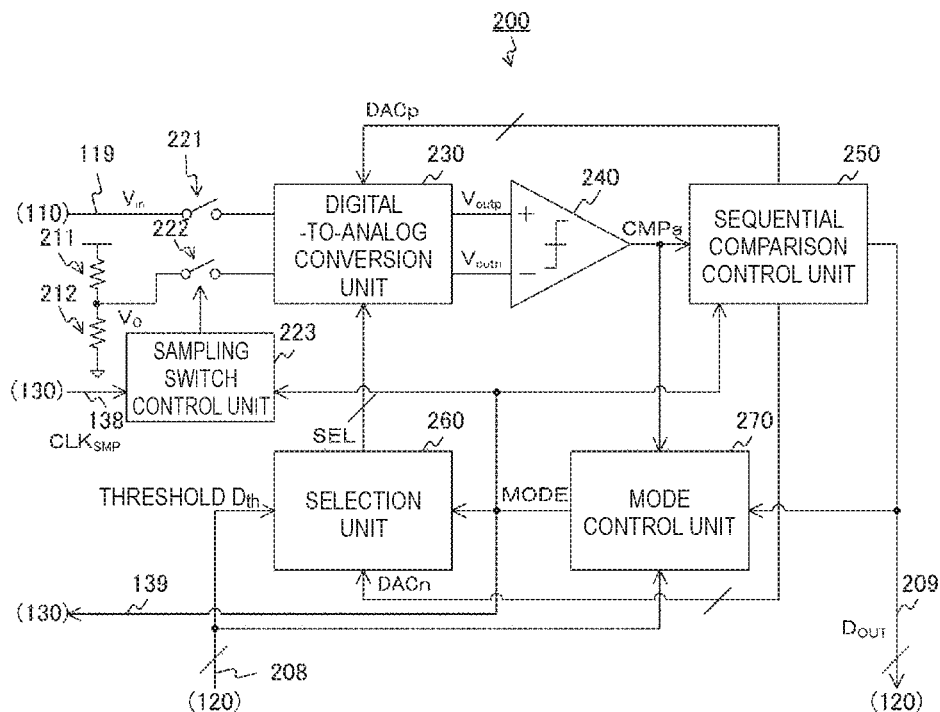
FIG. 2 is a block diagram illustrating a configuration example of an analog-to-digital converter according to the first embodiment of the present technology.
FIG. 3 is a diagram illustrating an example of an operation of a sampling switch control unit according to a first embodiment of the present technology.

FIG. 2 is a block diagram illustrating a configuration example of the analog-to-digital converter 200 according to the first embodiment. The analog-to-digital converter 200 includes resistors 211 and 212, sampling switches 221 and 222, and a sampling switch control unit 223. In addition, the analog-to-digital converter 200 includes a digital-to-analog conversion unit 230, a comparator 240, a sequential comparison control unit 250, a selection unit 260, and a mode control unit 270.

The resistors 211 and 212 are connected in series between a power terminal and a ground terminal. A connection point between the resistors 211 and 212 is connected to the sampling switch 222. A voltage of the connection point is assumed to be a fixed voltage $V_o$.

The sampling switches 221 and 222 sample the input voltage $V_{in}$ under the control of the sampling switch control unit 223. The sampling switch 221 opens and closes a path between the analog signal supply unit 110 and the digital-to-analog conversion unit 230. In addition, the sampling switch 222 opens and closes a path between the digital-to-analog conversion unit 230 and the connection point of the resistors 211 and 212.

The sampling switch control unit 223 controls the sampling switches 221 and 222 on the basis of the mode signal MODE. In the voltage range determination mode, the sampling switch control unit 223 performs control such that the sampling switch 221 enters a closed state (ON) and the sampling switch 222 enters an open state (OFF). On the other hand, in the AD conversion mode, the sampling switch control unit 223 performs control such that both the sampling switches 221 and 222 enter the closed state (ON) when the sampling clock $CLK_{SMP}$ is at a high level. On the other hand, the sampling switch control unit 223 performs such that both the sampling switches 221 and 222 enter the open state (OFF) when the sampling clock $CLK_{SMP}$ is at the low level.

The digital-to-analog conversion unit 230 generates a positive-side output signal $V_{outp}$ and a positive-side output signal $V_{outn}$ from signals output by the sampling switches 221 and 222 in accordance with a positive-side control signal DACp and a selection signal SEL from the selection unit 260. The digital-to-analog conversion unit 230 retains the signal ($V_{in}$) from the sampling switch 221 as the positive-side output signal $V_{outp}$ and retains the signal ($V_0$ or the like) from the sampling switch 222 as the negative-side output signal $V_{outn}$. Then, the digital-to-analog conversion unit 230 increases or decreases the positive-side output signal $V_{outp}$ in accordance with the positive-side control signal DACp and increases or decreases the negative-side output signal $V_{outn}$ in accordance with the selection signal SEL.

The comparator 240 compares the positive-side output signal $V_{outp}$ to the positive-side output signal $V_{outn}$. The comparator 240 supplies a comparison result CMPa to the sequential comparison control unit 250 and the mode control unit 270.

The sequential comparison control unit 250 generates the positive-side control signal DACp and the negative-side control signal DACn on the basis of the comparison result CMPa. The sequential comparison control unit 250 supplies the positive-side control signal DACp to the digital-to-analog conversion unit 230 and supplies the negative-side control signal DACn to the selection unit 260 in the AD conversion mode. In addition, the sequential comparison control unit 250 supplies a signal formed from N (where N is an integer) comparison results CMPa as the digital signal $D_{out}$ to the mode control unit 270 and the digital signal processing unit 120. On the other hand, in the voltage range determination mode, the sequential comparison control unit 250 stops generating the positive-side control signal DACp, the negative-side control signal DACn, and the digital signal $D_{out}$.

The selection unit 260 selects one of the threshold $D_{th}$ and the negative-side control signal DACn in accordance with the mode signal MODE. The selection unit 260 selects the threshold $D_{th}$ in the voltage range determination mode and selects the negative-side control signal DACn in the AD conversion mode. Then, the selection unit 260 supplies the selected signal as the selection signal SEL to the digital-to-analog conversion unit 230.

The mode control unit 270 controls the mode of the analog-to-digital converter 200. In the voltage range determination mode, the mode control unit 270 monitors the comparison result CMPa and determines whether the analog signal ($V_{in}$) is within the setting range. For example, in a case in which a lower limit of the setting range is set as a threshold and the comparison result CMPa indicating that the analog signal is greater than the threshold is generated, the analog signal ($V_{in}$) can be determined to be within the setting range. In a case in which the analog signal is within the setting range, the mode control unit 270 transitions the mode from the voltage range determination mode to the AD conversion mode.

In addition, in the AD conversion mode, the mode control unit 270 compares the signal to the threshold $D_{th}$ and determines whether the digital signal $D_{out}$ is within the setting range whenever the digital signal $D_{out}$ is generated. Then, in a case in which the digital signal $D_{out}$ is outside of the setting range, the mode control unit 270 transitions the mode from the AD conversion mode to the voltage range determination mode. The mode control unit 270 generates the mode signal MODE indicating the current mode and supplies the mode signal MODE to the sampling switch control unit 223, the sequential comparison control unit 250, the selection unit 260, and the sampling clock supply unit 130.

Note that the mode control unit 270 may supply an enable signal to the sequential comparison control unit 250 instead of the mode signal MODE. In this case, disabling is set in the voltage range determination mode and enabling is set in the AD conversion mode.

As described above, in the voltage range determination mode, the threshold $D_{th}$ is supplied as the selection signal SEL to the digital-to-analog conversion unit 230. Then, the comparator 240 compares the digital signal $D_{out}$ to the analog signal ($V_{in}$). In the voltage range determination mode, the sequential comparison control unit 250 stops the operation. Therefore, power consumption of the analog-to-digital converter 200 is less than in the AD conversion mode.

On the other hand, in the AD conversion mode, the negative-side control signal DACn is supplied as the selection signal SEL to the digital-to-analog conversion unit 230. Then, the comparator 240 generates bits (CMPa) of the digital signal in order in accordance with the negative-side control signal DACn and the positive-side control signal DACp. In this way, the comparator 240 is used for both comparison between the analog signal and the threshold $D_{th}$ and the AD conversion.

The comparison between the analog signal and the threshold $D_{th}$ is realized by adding a comparator apart from the comparator 240. In this configuration, power consumption of the analog-to-digital converter 200 may increase due to the added comparator. In contrast, in the above-described analog-to-digital converter 200, it is not necessary to add a comparator since the comparator 240 is commonly used for both comparison between the analog signal and the threshold $D_{th}$ and the AD conversion. It is necessary to add the selection unit 260, but since the selection unit 260 is realized by a digital circuit such as a logic gate, an amount of power consumption increased due to the selection unit 260 can be minimized.

FIG. 3 is a diagram illustrating an example of an operation of the sampling switch control unit 223 according to the first embodiment. In the voltage range determination mode, the sampling switch control unit 223 turns the positive-side sampling switch 221 on and turns the negative-side sampling switch 222 off. On the other hand, in the AD conversion mode, the sampling switch control unit 223 turns both the sampling switches 221 and 222 on when the sampling clock $CLK_{SMP}$ is at the high level.

[Configuration Examples of Digital-to-Analog Conversion Unit and Selection Unit]

Figure 4:
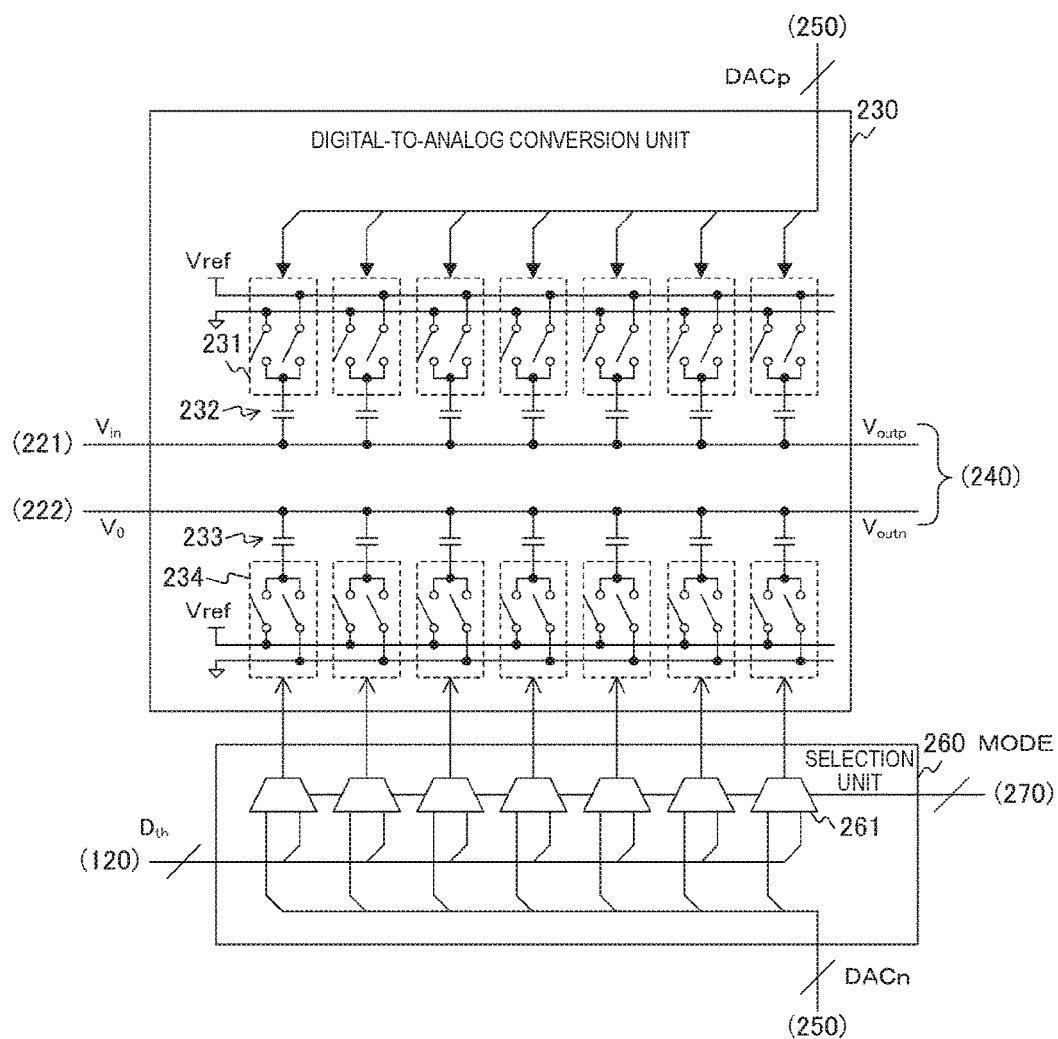
FIG. 4 is a circuit diagram illustrating a configuration example of a digital-to-analog conversion unit and a selection unit according to the first embodiment of the present technology.

FIG. 4 is a circuit diagram illustrating a configuration example of the digital-to-analog conversion unit 230 and the selection unit 260 according to the first embodiment. The digital-to-analog conversion unit 230 includes N positive-side switches 231, N positive-side capacitors 232, N negative-side capacitors 233, and N negative-side switches 234. In addition, the positive-side control signal DACp has N bits and an n-th (where n is an integer from 0 to N−1) bit from the head of the positive-side control signal DACp is input to an n-th positive-side switch 231. In addition, the selection signal SEL has N bits and an n-th bit in the selection signal SEL is input to an n-th negative-side switch 234.

The positive-side capacitor 232 retains the signal ($V_{in}$) from the sampling switch 221 as the positive-side output signal $V_{outp}$. In addition, capacitance of each of the N positive-side capacitors 232 differs and one end of the n-th positive-side capacitor 232 is connected to the n-th positive-side switch 231. The other end of the N positive-side capacitors 232 is connected in common to a non-inversion input terminal (+) of the comparator 240.

The negative-side capacitor 233 retains the signal ($V_O$) from the sampling switch 222 as the negative-side output signal $V_{outn}$. In addition, capacitance of each of the N negative-side capacitors 233 differs and one end of the n-th negative-side capacitor 233 is connected to the n-th negative-side switch 234. The other end of the N negative-side capacitors 233 is connected in common to an inversion input terminal (−) of the comparator 240.

The positive-side switch 231 supplies either a reference voltage $V_{ref}$ or a ground potential to the corresponding positive-side capacitor 232 in accordance with a bit corresponding to the positive-side control signal DACp.

The negative-side switch 234 supplies either the reference voltage $V_{ref}$ or the ground potential to the corresponding negative-side capacitor 233 in accordance with a bit corresponding to the selection signal SEL.

In addition, the selection unit 260 includes N selectors 261. In addition, a data size of the threshold $D_{th}$ is N bits and an n-th bit of the threshold $D_{th}$ is input to an n-th selector 261. In addition, the negative-side control signal DACn also has N bits and an n-th bit in the negative-side control signal DACn is input to the n-th selector 261.

The selector 261 selects either a bit corresponding to the threshold $D_{th}$ or a bit corresponding to the negative-side control signal DACn in accordance with the mode signal MODE. The selector 261 selects the bit corresponding to the threshold $D_{th}$ in the voltage range determination mode and selects the bit corresponding to the negative-side control signal DACn in the AD conversion mode. The signal including the bit selected by the selector 261 is input as the selection signal SEL to the digital-to-analog conversion unit 230.

In the above-described configuration, in the voltage range determination mode, the digital-to-analog conversion unit 230 outputs the analog signal $V_{in}$ as the positive-side output signal $V_{outp}$ and outputs the signal with a level in accordance with the selection signal SEL (that is, the threshold $D_{th}$) as the positive-side output signal $V_{outn}$. On the other hand, in the AD conversion mode, the digital-to-analog conversion unit 230 first retains the input voltage $V_{in}$ and the fixed voltage $V_O$ as the positive-side output signal $V_{outp}$ and the negative-side output signal $V_{outn}$. Then, the digital-to-analog conversion unit 230 increases or decreases the positive-side output signal $V_{outp}$ in accordance with the positive-side control signal DACp and increases or decreases the negative-side output signal $V_{outn}$ in accordance with the selection signal SEL (that is, the negative-side control signal DACn).

Note that the analog signal ($V_{in}$) is input to the positive side of the digital-to-analog conversion unit 230, but the analog signal ($V_{in}$) may be input to the negative side. In this case, the selection unit 260 selects one of the positive-side control signal DACp and the threshold $D_{th}$ and supplies the selected signal or threshold to the positive-side switch 231.

FIG. 5 is a diagram illustrating an example of an operation of the selection unit 260 according to the first embodiment. In the voltage range determination mode, the selection unit 260 selects the threshold $D_{th}$ and outputs the threshold $D_{th}$ to the digital-to-analog conversion unit 230. On the other hand, in the AD conversion mode, the selection unit 260 selects the negative-side control signal DACn and outputs the negative-side control signal DACn to the digital-to-analog conversion unit 230.

FIG. 6 is a graph illustrating an example of a variation in a comparator input voltage according to the first embodiment. In the drawing, the vertical axis represents an input voltage ($V_{outp}$-$V_{outn}$) of the comparator 240 and the horizontal axis represents time.

In the AD conversion mode, the digital-to-analog conversion unit 230 first retains the input voltage $V_{in}$ and the fixed voltage $V_0$. A difference between the input voltage $V_{in}$ and the fixed voltage $V_0$ is assumed to be, for example, 0 volts (V) or less. At this time, the comparator 240 outputs a low level as the comparison result CMPa.

At time t1, the sequential comparison control unit 250 increases the positive-side output voltage $V_{outp}$ by $V_{ref}/2$ using the positive-side control signal DACp in accordance with the comparison result CMPa. As a result, the input voltage ($V_{outp}$-$V_{outn}$) of the comparator 240 is assumed to increase to be greater than 0 volts (V). At this time, the comparator 240 outputs the high level as the comparison result CMPa.

At time t2, the sequential comparison control unit 250 decreases the positive-side output voltage $V_{outp}$ by $V_{ref}/4$ with the positive-side control signal DACp in accordance with the comparison result CMPa. As a result, the input voltage ($V_{outp}$-$V_{outn}$) of the comparator 240 is assumed to decrease and to be greater than 0 volts (V) after the decrease. At this time, the comparator 240 outputs the high level as the comparison result CMPa.

Thereafter, the sequential comparison control unit 250 similarly performs control such that the input voltage ($V_{outp}$-$V_{outn}$) of the comparator 240 becomes 0 volts (V) on the basis of the comparison result CMPa of the comparator 240. In addition, the absolute value of the voltage increased or decreased for each comparison is lessened. In this way, the ADC controlling the input voltage in accordance with the comparison result of the comparator is referred to as a sequential comparison ADC.

[Configuration Example of Mode Control Unit]

FIG. 7 is a block diagram illustrating a configuration example of the mode control unit 270 according to the first embodiment. The mode control unit 270 includes a mode transition unit 271 and a threshold comparison unit 272.

The threshold comparison unit 272 compares the digital signal $D_{out}$ to the threshold $D_{th}$. The threshold comparison unit 272 supplies a comparison result as CMPd to the mode transition unit 271.

The mode transition unit 271 transitions the mode on the basis of the comparison results CMPa and CMPd. The mode transition unit 271 sets, for example, the voltage range determination mode in the initial state. Then, in the voltage range determination mode, the mode transition unit 271 monitors the comparison result CMPa and determines whether the analog signal ($V_{in}$) is within the setting range.

In a case in which the analog signal is within the setting range, the mode control unit 270 transitions the mode from the voltage range determination mode to the AD conversion mode.

On the other hand, in the AD conversion mode, the mode transition unit 271 determines whether the digital signal ($V_{out}$) is within the setting range on the basis of the comparison result CMPd. In a case in which the digital signal is outside of the setting range, the mode control unit 270 transitions the mode from the AD mode to the voltage range determination mode. The mode transition unit 271 generates the mode signal MODE indicating a current mode and outputs the mode signal MODE to the selection unit 260 or the like.

FIG. 8 is a diagram illustrating an example of an operation of the mode transition unit 271 according to the first embodiment. In this example, the threshold is assumed to be the lower limit of the setting range. In a case in which the comparison result CMPa indicates that the input voltage $V_{in}$ is greater than the threshold $D_{th}$ in the voltage range determination mode, the mode transition unit 271 transitions the mode signal MODE from the voltage range determination mode (for example, "0") to the AD conversion mode (for example, "1").

On the other hand, in a case in which the comparison result CMPd indicates that the input voltage $V_{in}$ is equal to or less than the threshold $D_{th}$ in the AD conversion mode, the mode transition unit 271 transitions the mode signal MODE from the AD conversion mode (for example, "1") to the voltage range determination mode (for example, "0").

[Operation Example of Analog-to-Digital Converter]

Figure 9:
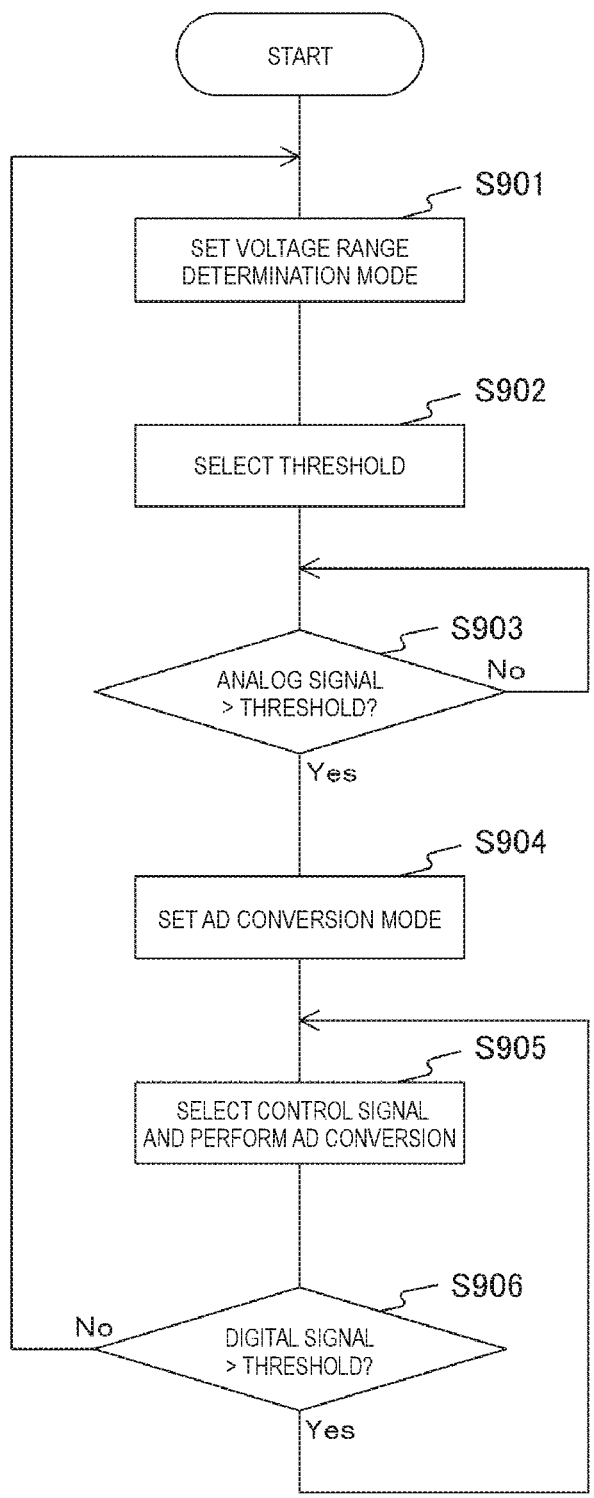
FIG. 9 is a flowchart illustrating an example of an operation of the analog-to-digital converter according to the first embodiment of the present technology.

FIG. 9 is a diagram illustrating an example of an operation of the analog-to-digital converter 200 according to the first embodiment. The operation starts, for example, when power is fed to the analog-to-digital converter 200.

The mode control unit 270 of the analog-to-digital converter 200 sets the voltage range determination mode (step S901). Then, the selection unit 260 selects the threshold $D_{th}$ (step S902). The comparator 240 determines whether the analog signal ($V_{in}$) is greater than the threshold $D_{th}$ (step S903). In a case in which the analog signal is equal to or less than the threshold $D_{th}$ (No in step S903), the comparator 240 repeats step S903. Conversely, in a case in which the analog signal is greater than the threshold $D_{th}$ (Yes in step S903), the mode control unit 270 sets the AD conversion mode (step S904).

In the AD conversion mode, the selection unit 260 selects the negative-side control signal DACn and the comparator 240 or the like performs the AD conversion (step S905). The mode control unit 270 determines whether the digital signal ($D_{out}$) is greater than the threshold $D_{th}$ (step S906). In a case in which the digital signal is greater than the threshold $D_{th}$ (Yes in step S906), the comparator 240 or the like repeatedly performs processes subsequent to step S905. Conversely, in a case in which the digital signal is equal to or less than the threshold $D_{th}$ (No in step S906), the analog-to-digital converter 200 repeatedly performs the processes subsequent to step S901.

Figure 10:
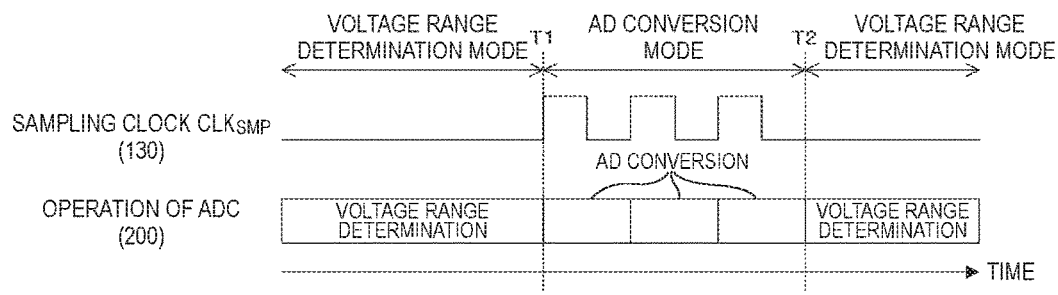
FIG. 10 is a timing chart illustrating an example of an operation of the analog-to-digital converter according to the first embodiment of the present technology.

FIG. 10 is a timing chart illustrating an example of an operation of the analog-to-digital converter 200 according to the first embodiment. In the voltage range determination mode, the sampling clock supply unit 130 stops supplying the sampling clock $CLK_{SMP}$ and the analog-to-digital converter 200 determines whether the analog signal is within the setting range.

When it is determined at time T1 that the analog signal is within the setting range, the analog-to-digital converter 200 transitions the mode to the AD conversion mode. In addition, the sampling clock supply unit 130 starts supplying the sampling clock $CLK_{SMP}$. In the AD conversion mode, the analog-to-digital converter 200 performs the AD conversion in synchronization with the sampling clock $CLK_{SMP}$. Then, when it is determined at time T2 that the digital signal is within the setting range, the analog-to-digital converter 200 transitions the mode to the voltage range determination mode.

Figure 11:
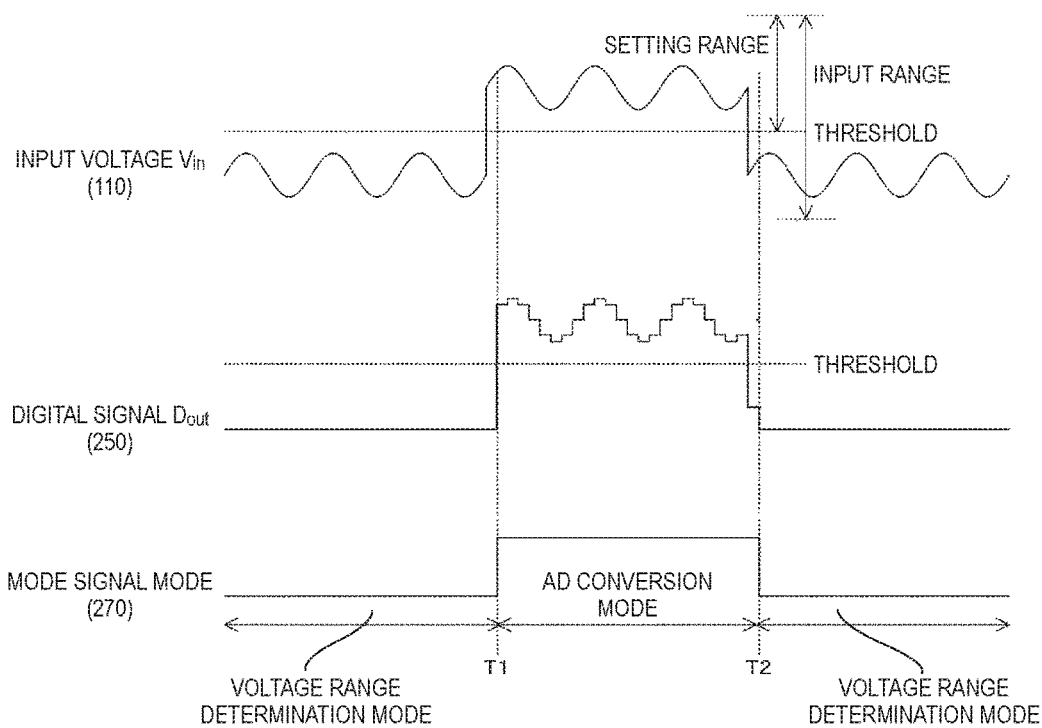
FIG. 11 is a timing chart illustrating examples of variations in an input voltage, a digital signal, and a mode signal according to the first embodiment of the present technology.

FIG. 11 is a timing chart illustrating examples of variations in an input voltage, a digital signal, and a mode signal according to the first embodiment. Within an input range in which the AD conversion can be performed, for example, a range from the threshold value of the lower limit to the upper limit of the input range is set in advance as a setting range.

In the voltage range determination mode, the mode control unit 270 sets a low level in the mode signal MODE. In addition, the sequential comparison control unit 250 stops a sequential comparison operation related to the AD conversion and the comparator 240 determines whether the input voltage $V_{in}$ is within the setting range.

When the input voltage $V_{in}$ is greater than the threshold immediately before time T1, the mode control unit 270 sets the high level in the mode signal MODE at time T1. In addition, the comparator 240 and the sequential comparison control unit 250 start the AD conversion.

Then, when the input voltage $V_{in}$ is equal to or less than the threshold immediately before time T2, the mode control unit 270 sets the low level in the mode signal MODE at time T2. In addition, the sequential comparison control unit 250 stops the sequential comparison operation and the comparator 240 determines whether the input voltage $V_{in}$ is within the setting range.

Figures 12, 13:
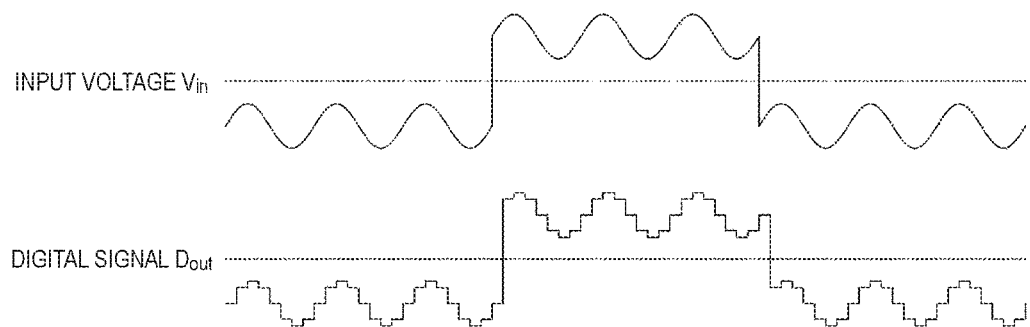
FIG. 12 is a timing chart illustrating examples of variations in an input voltage and a digital signal according to a comparative example.
FIG. 13 is a diagram illustrating an example of an operation of a selection unit according to a first modification example of the first embodiment of the present technology.

FIG. 12 is a timing chart illustrating examples of variations in an input voltage and a digital signal according to a comparative example. The analog-to-digital converter 200 according to the comparative example continues the AD conversion irrespective of the value of the input voltage without setting the threshold for the input voltage.

In contrast with the comparative example in which the AD conversion is normally performed, as described above, the analog-to-digital converter 200 performs the AD conversion only in a case in which the input voltage $V_{in}$ is within the setting range and stops the AD conversion in a case in which the input voltage $V_{in}$ is outside of the setting range, as exemplified in FIG. 11. Therefore, compared to the comparative example, it is possible to reduce power consumption of the analog-to-digital converter 200.

In this way, according to the first embodiment of the present technology, the comparator 240 compares the input voltage to the threshold in the voltage range determination mode. When the input voltage is within the setting range, the mode transitions to the AD conversion mode and the AD conversion is performed. Therefore, the AD conversion is stopped when the input voltage is outside of the setting range. Thus, it is possible to reduce power consumption.

FIRST MODIFICATION EXAMPLE

In the above-described first embodiment, the setting range has been set with one of the upper limit and the lower limit, but the setting range can be requested to be set with both the upper limit and the lower limit in some cases. For example, in a case in which a signal from a temperature sensor assumed to be used indoors is monitored, a temperature range of a general indoor temperature such as a temperature from 0 degrees to 35 degrees is set as the setting range and the signal within the setting range is processed. In this case, the analog-to-digital converter 200 may select each of the upper limit and the lower limit of the setting range in order and compare each of the upper limit and the lower limit with the analog signal. The analog-to-digital converter 200 according to a first modification example of the first embodiment differs from that of the first embodiment in that each of the upper limit and the lower limit of the setting range is compared to the analog signal.

FIG. 13 is a diagram illustrating an example of an operation of the selection unit 260 according to the first modification example of the first embodiment. A voltage range determination mode according to the first modification example of the first embodiment includes a lower-limit determination mode in which it is determined whether an input signal is greater than a lower limit $D_{thL}$ and an upper-limit determination mode in which it is determined whether the input signal is greater than an upper limit $D_{thU}$. Then, in the mode signal MODE, one of the lower-limit determination mode, the upper-limit determination mode, and the AD conversion mode is set.

The selection unit 260 selects the lower limit $D_{thL}$ and outputs the lower limit $D_{thL}$ to the digital-to-analog conversion unit 230 in the lower-limit determination mode, and selects the upper limit $D_{thU}$ and outputs the upper limit $D_{thU}$ to the digital-to-analog conversion unit 230 in the upper-limit determination mode. In addition, in the AD conversion mode, the selection unit 260 selects the negative-side control signal DACn and outputs the negative-side control signal DACn to the digital-to-analog conversion unit 230.

FIG. 14 is a diagram illustrating an example of an operation of the mode transition unit 271 according to the first modification example of the first embodiment. In the voltage range determination mode, for example, the mode transition unit 271 is assumed to alternately set the upper-limit determination mode and the lower-limit determination mode whenever a predetermined period passes.

In a case in which the comparison result CMPa indicates that the input voltage $V_{in}$ is greater than the lower limit in the lower-limit determination mode, the mode transition unit 271 turns an internal flag on. An initial value of the internal flag is set to be turned off. Then, after the predetermined period passes, the mode transition unit 271 transitions the mode signal MODE from the lower-limit determination mode (for example, "0") to the upper-limit determination mode (for example "1").

In a case in which the comparison result CMPa indicates that the input voltage $V_{in}$ is equal to or less than the upper limit in the upper-limit determination mode and the internal flag is turned on, the mode transition unit 271 transitions the mode signal MODE from the upper-limit determination mode to the AD conversion mode (for example, "2"). In a case in which the input voltage $V_{in}$ is greater than the upper limit or the internal flag is turned off (that is, equal to or less than the lower limit), the mode transition unit 271 transitions the mode signal MODE from the upper-limit determination mode to the lower-limit determination mode after the predetermined period passes.

In the AD conversion mode, the mode transition unit 271 determines whether the digital signal ($V_{out}$) is within the setting range on the basis of the comparison result CMPd. In a case in which the digital signal is outside of the setting range, the mode control unit 270 transitions the mode from the AD mode to the lower-limit determination mode.

Figure 15:
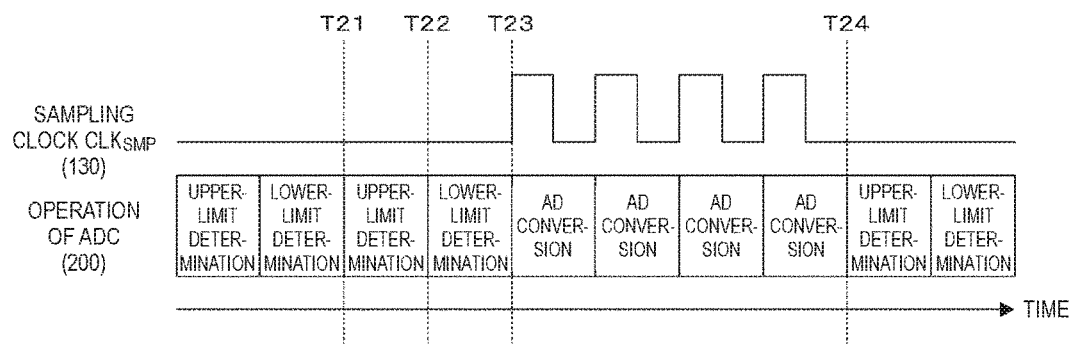
FIG. 15 is a timing chart illustrating an example of an operation of an analog-to-digital converter according to the first modification example of the first embodiment of the present technology.

FIG. 15 is a timing chart illustrating an example of an operation of the analog-to-digital converter 200 according to the first modification example of the first embodiment. In the voltage range determination mode, the analog-to-digital converter 200 selects the upper limit and the lower limit in order and compares the upper limit and the lower limit to the analog signal.

For example, at time T21, the analog-to-digital converter 200 transitions the mode to the upper-limit determination mode and compares the upper limit to the analog signal. Then, at time T22 at which a predetermined period passed from time T21, the analog-to-digital converter 200 transitions the mode to the lower-limit determination mode and compares the lower limit to the analog signal. Then, when it is determined at time T23 that that analog signal is within a range from the lower limit to the upper limit, the analog-to-digital converter 200 transitions the mode to the AD conversion mode.

Note that the mode transition unit 271 alternately sets the upper-limit determination mode and the lower-limit determination mode whenever the predetermined period passes, but the present technology is not limited to this configuration. For example, the mode transition unit 271 may set one of the upper-limit determination mode and the lower-limit determination mode. In a case in which a condition that the signal is greater than the lower limit is satisfied, the mode may transition to the other of the upper-limit determination mode and the lower-limit determination mode.

Figure 16:
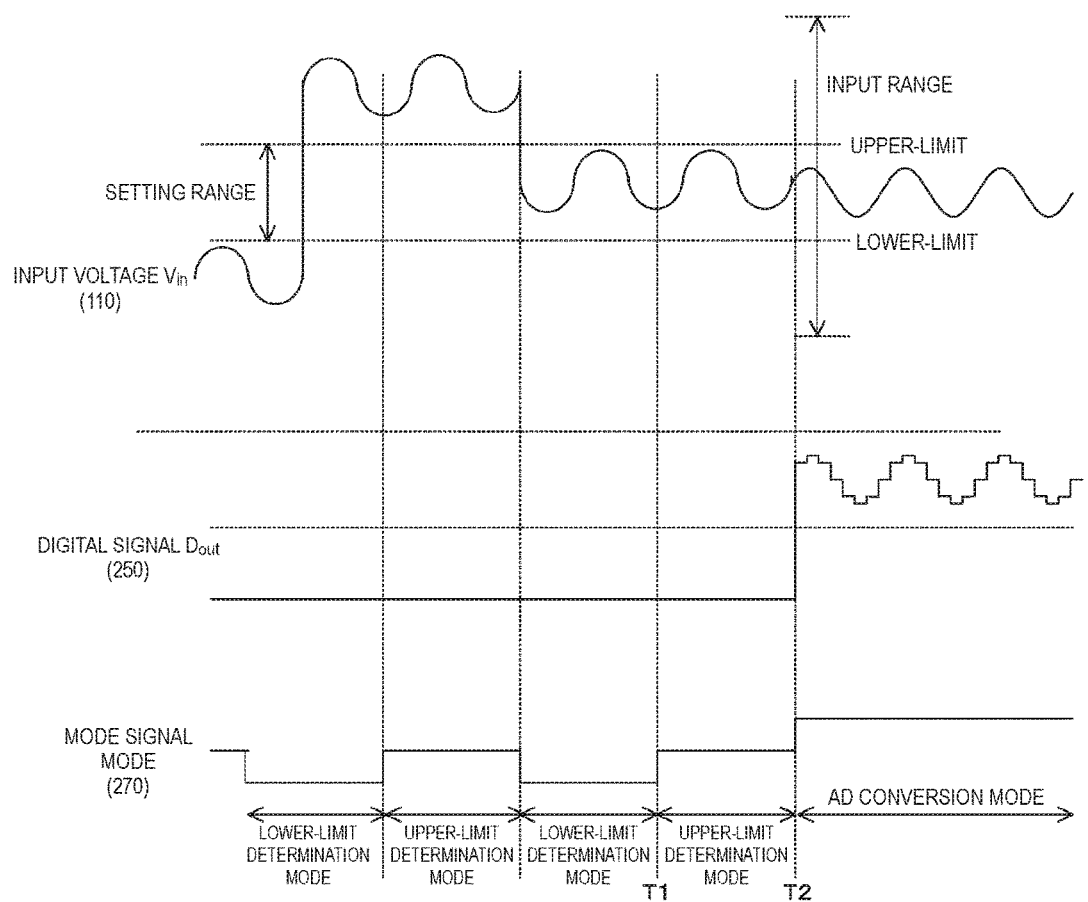
FIG. 16 is a timing chart illustrating examples of variations in an input voltage, a digital signal, and a mode signal according to the first modification example of the first embodiment of the present technology.

FIG. 16 is a timing chart illustrating examples of variations in an input voltage, a digital signal, and a mode signal according to the first modification example of the first embodiment.

In the lower-limit determination mode, the mode control unit 270 sets "0" in the mode signal MODE. In addition, the sequential comparison control unit 250 stops the sequential comparison operation and the comparator 240 determines whether the input voltage $V_{in}$ is greater than the lower limit.

At time T1 at which a predetermined period has passed after the transition to the lower-limit determination mode, the mode control unit 270 sets "1" (the upper-limit determination mode) in the mode signal MODE. In addition, the sequential comparison control unit 250 stops the sequential comparison operation and the comparator 240 determines whether the input voltage $V_{in}$ is greater than the upper limit.

When the input voltage $V_{in}$ is within the setting range in the upper-limit determination mode and the lower-limit determination mode, the mode control unit 270 sets "2" (the AD conversion mode) in the mode signal MODE at time T2. In addition, the comparator 240 and the sequential comparison control unit 250 start the AD conversion.

In this way, according to the first modification example of the first embodiment of the present technology, the comparator 240 compares the input voltage to the upper limit and the lower limit. Therefore, in a case in which the input voltage is outside of the setting range from the upper limit and the lower limit, the AD conversion is stopped. Thus, it is possible to reduce power consumption.

SECOND MODIFICATION EXAMPLE

In the above-described first embodiment, the sampling clock supply unit 130 stops supplying the sampling clock $CLK_{SMP}$ in the voltage range determination mode. However, in the voltage range determination mode, since the negative-side sampling switch 222 is in the open state, its output terminal enters a floating state. Accordingly, when a period in which the supply of the sampling clock $CLK_{SMP}$ is stopped is lengthened, there is a concern of a voltage of the output terminal of the sampling switch 222 varying due to a leakage current. Thus, there is a possibility of the comparison between the analog signal and the threshold not being accurately performed. The analog-to-digital converter 200 according to the second modification example of the first embodiment differs from that of the first embodiment in that the comparison with the threshold in the voltage range determination mode is accurately performed.

Figure 17:
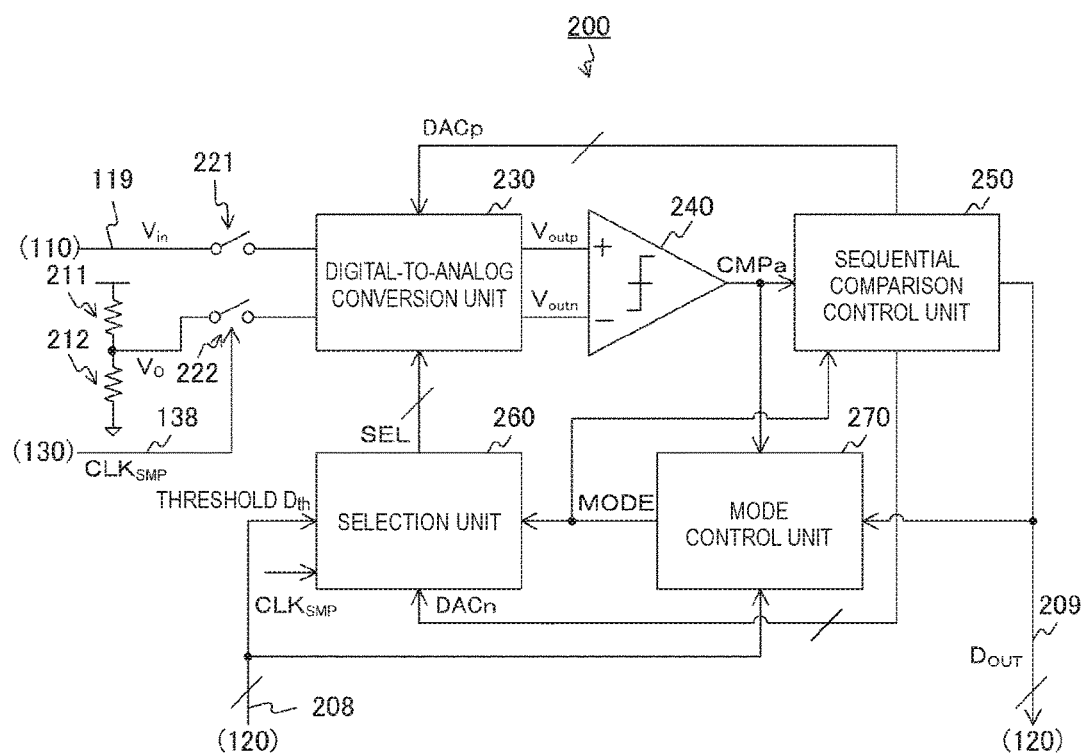
FIG. 17 is a block diagram illustrating a configuration example of an analog-to-digital converter according to a second modification example of the first embodiment of the present technology.

FIG. 17 is a block diagram illustrating a configuration example of an analog-to-digital converter 200 according to the second modification example of the first embodiment. The analog-to-digital converter 200 according to the second modification example of the first embodiment differs from that of the first embodiment in that the sampling switch control unit 223 is not included.

The sampling switches 221 and 222 according to the second modification example transition to a closed state in a case in which the sampling clock $CLK_{SMP}$ is at a high level. In addition, the mode control unit 270 according to the second modification example does not supply the mode signal MODE to the sampling clock supply unit 130. Then, the sampling clock supply unit 130 according to the second modification example normally supplies the sampling clock $CLK_{SMP}$ irrespective of the mode.

FIG. 18 is a diagram illustrating an example of an operation of the selection unit 260 according to the second modification example of the first embodiment. In the voltage range determination mode, the selection unit 260 selects and outputs the threshold $D_{th}$ when the sampling clock $CLK_{SMP}$ is at a low level, and stops outputting the threshold $D_{th}$ when the sampling clock $CLK_{SMP}$ is at a high level. On the other hand, in the AD conversion mode, the selection unit 260 selects and outputs the negative-side control signal DACn.

Figure 19:
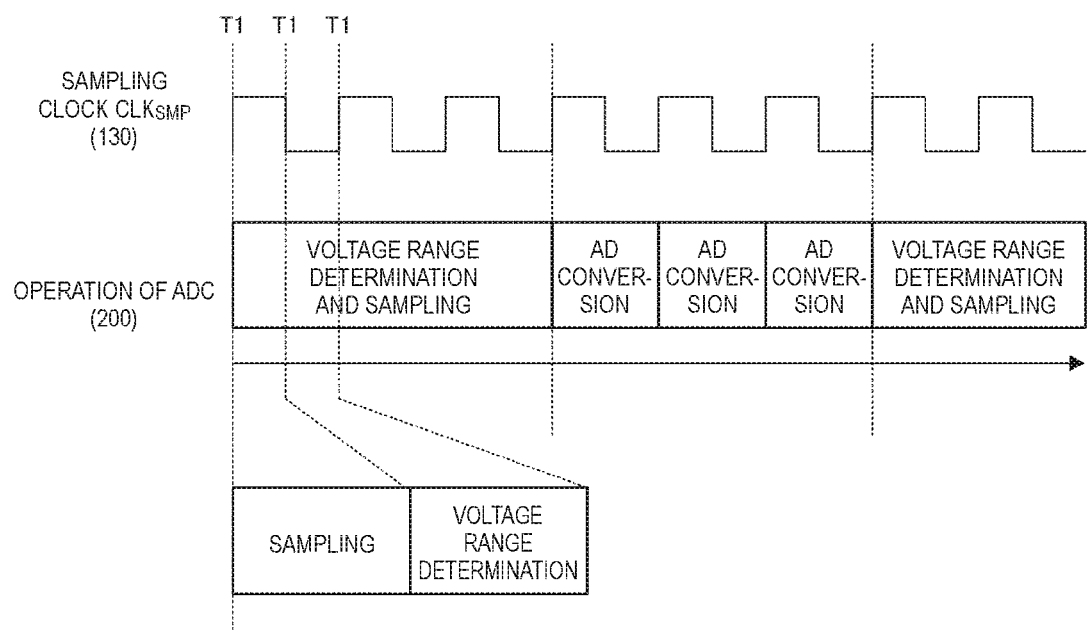
FIG. 19 is a timing chart illustrating an example of an operation of an analog-to-digital converter according to the second modification example of the first embodiment of the present technology.

FIG. 19 is a timing chart illustrating an example of an operation of the analog-to-digital converter 200 according to the second modification example of the first embodiment. In the voltage range determination mode, the analog-to-digital converter 200 samples the analog signal when the sampling clock $CLK_{SMP}$ is at the high level. Conversely, the analog-to-digital converter 200 determines whether the sampled analog signal is within the setting range when the sampling clock $CLK_{SMP}$ is at the low level. In addition, in the AD conversion mode, the analog-to-digital converter 200 performs AD conversion in synchronization with the sampling clock $CLK_{SMP}$.

In this way, according to the second modification example of the first embodiment of the present technology, since the sampling switch 222 is opened and closed in synchronization with the sampling clock $CLK_{SMP}$ in the voltage range determination mode, it is possible to prevent the output terminal from varying. Thus, it is possible to accurately compare the analog signal to the threshold.

THIRD MODIFICATION EXAMPLE

In the above-described first embodiment, the analog-to-digital converter 200 has transition the mode to the voltage range determination mode in the case in which the digital signal is outside of the setting range in the AD conversion mode. However, there is a concern about an increase in a circuit size of a circuit determining whether the digital signal is within the setting range as a data size of the digital signal increases. The analog-to-digital converter 200 according to a third modification example of the first embodiment differs from that of the first embodiment in that the circuit size is prevented from increasing.

FIG. 20 is a diagram illustrating a configuration example of the mode control unit 270 according to a third modification example of the first embodiment. The mode control unit 270 according to the third modification example of the first embodiment differs from that of the first embodiment in that a counter 273 is included instead of the threshold comparison unit 272.

The counter 273 counts the number of AD conversions. For example, the counter 273 counts a count value in synchronization with the sampling clock $CLK_{SMP}$.

The mode transition unit 271 according to the third modification example initializes the count value of the counter 273 at the time of transition of the mode to the AD conversion mode and transitions the mode to the voltage range determination mode. Note that the mode transition unit 271 initializes the count value at the time of transition to the AD conversion mode, but the mode transition unit 271 may initialize the count value at the time of transition to the voltage range determination mode.

FIG. 21 is a diagram illustrating an example of an operation of the mode transition unit 271 according to the third modification example of the first embodiment. The operation of the mode transition unit 271 in the voltage range determination mode is the same as that of the first embodiment. On the other hand, in the AD conversion mode, the mode transition unit 271 transitions the mode to the voltage range determination mode when the number of AD conversions is greater than a given number of times.

In this way, according to the third modification example of the first embodiment of the present technology, when the number of AD conversions is greater than the given number of times, the analog-to-digital converter 200 transitions the mode to the voltage range determination mode, and thus can control the mode without comparing the digital signal to the threshold. Thus, the circuit that compares the digital signal to the threshold is not necessary, and thus it is possible to prevent the circuit size from increasing.

FOURTH MODIFICATION EXAMPLE

In the above-described first embodiment, the setting range has been set by one threshold, but the setting range can also be set by three or more thresholds. The analog-to-digital converter 200 according to a fourth modification example of the first embodiment differs from that of the first embodiment in that three or more thresholds are compared to the analog signal.

Figure 22:
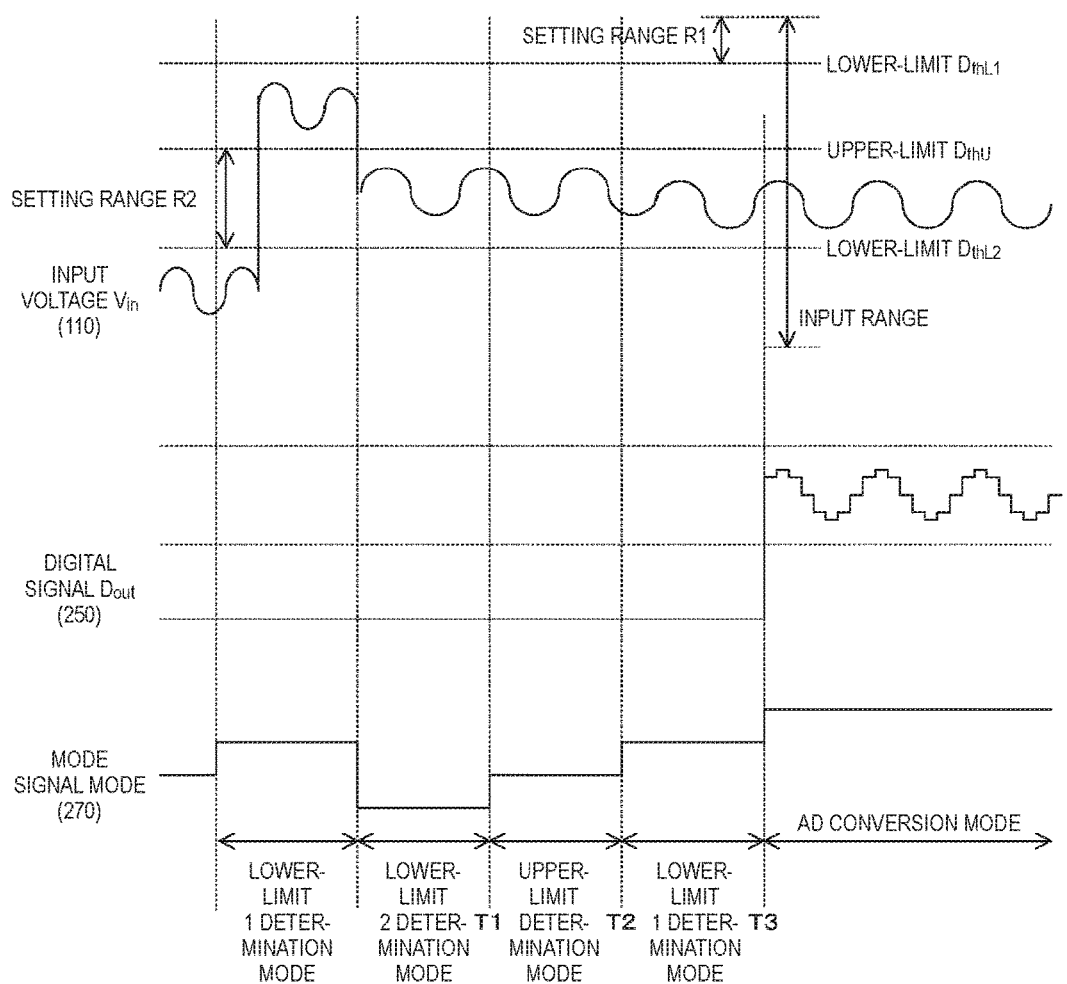
FIG. 22 is a timing chart illustrating examples of variations in an input voltage, a digital signal, and a mode signal according to a fourth modification example of the first embodiment of the present technology.

FIG. 22 is a timing chart illustrating examples of variations in an input voltage, a digital signal, and a mode signal according to the fourth modification example of the first embodiment. In the fourth modification example of the first embodiment, the setting range includes setting ranges R1 and R2. The setting range R1 is, for example, a range greater than a lower limit $D_{thL1}$. In addition, the setting range R2 is, for example, a range greater than a lower limit $D_{thL2}$ and equal to or less than an upper limit $D_{thU}$.

In addition, the voltage range determination mode includes a lower-limit 2 determination mode, an upper-limit determination mode, and a lower-limit 1 determination mode. In the lower-limit 2 determination mode, the analog-to-digital converter 200 determines whether the input voltage $V_{in}$ is greater than the lower limit $D_{thL2}$. In addition, in the upper-limit determination mode, the analog-to-digital converter 200 determines whether the input voltage $V_{in}$ is equal to or less than the upper limit $D_{thU}$. In the lower-limit 1 determination mode, the analog-to-digital converter 200 determines whether the input voltage $V_{in}$ is greater than the lower limit $D_{thL1}$.

On the basis of the determination results, the analog-to-digital converter 200 determines whether the input voltage $V_{in}$ is within one of the setting ranges R1 and R2. In a case in which the input voltage $V_{in}$ is within one of the setting ranges R1 and R2, the analog-to-digital converter 200 transitions the mode to the AD conversion mode. In addition, in the AD conversion mode, the analog-to-digital converter 200 determines whether the digital signal is within one of the setting ranges R1 and R2. In a case in which the digital signal is within one of the setting ranges R1 and R2 in the AD conversion mode, the analog-to-digital converter 200 transitions the mode to, for example, the lower-limit 2 determination mode.

Note that the analog-to-digital converter 200 compares the three thresholds to the analog signal, but four or more thresholds may be compared to the analog signal.

In this way, according to the fourth modification example of the first embodiment of the present technology, the analog-to-digital converter 200 compares three or more thresholds to the analog signal, and thus can control the mode controls the mode in various setting ranges.

<2. Second Embodiment>

In the above-described first embodiment, the analog-to-digital converter 200 performs the AD conversion on the single end signal. Here, a specification or a signal transmission standard of the analog signal supply unit 110 corresponds to a differential signal, but does not correspond to the single end signal in some cases. In this case, the analog-to-digital converter 200 may perform the AD conversion on the differential signal instead of the single end signal. The analog-to-digital converter 200 according to a second embodiment differs from that of the first embodiment in that the differential signal is subjected to the AD conversion.

Figure 23:
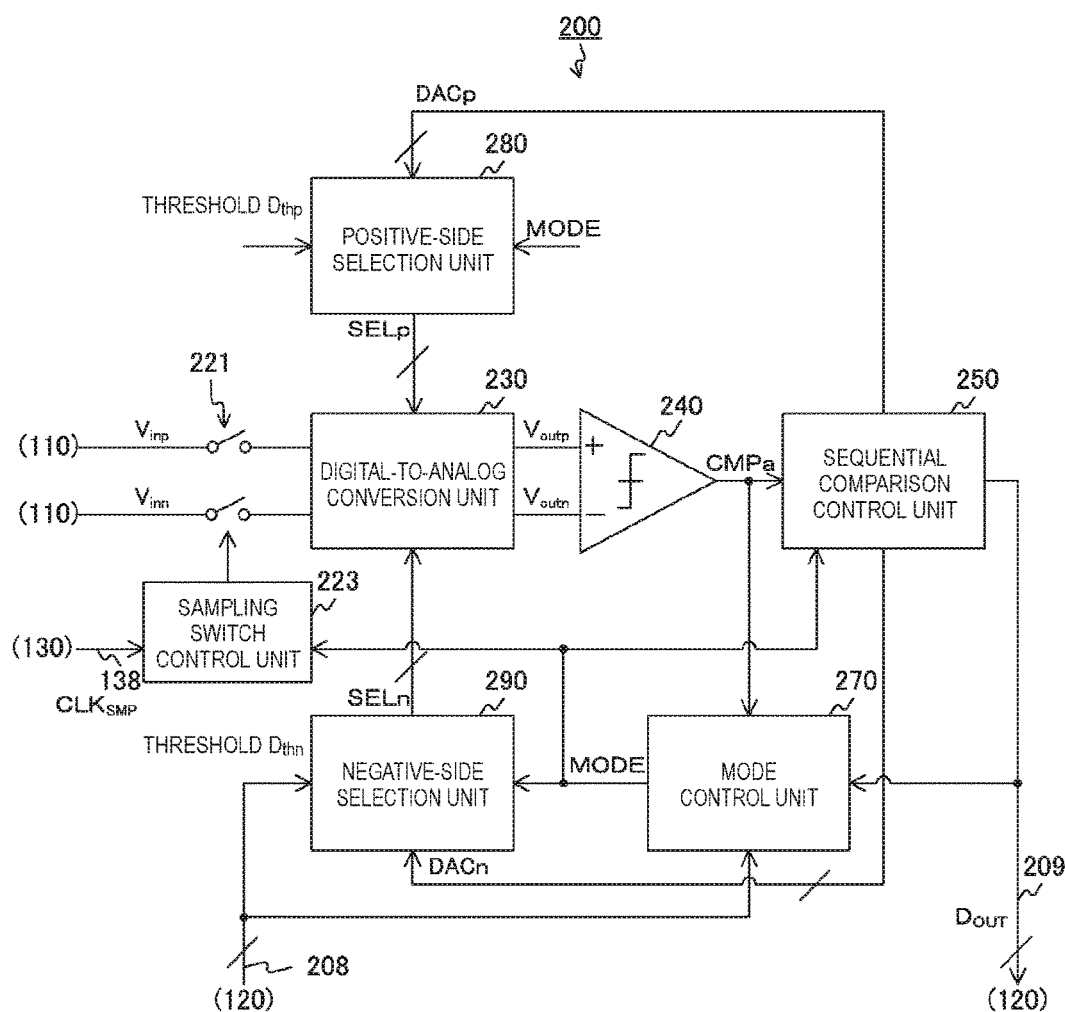
FIG. 23 is a block diagram illustrating a configuration example of an analog-to-digital converter according to a second embodiment of the present technology.

FIG. 23 is a block diagram illustrating a configuration example of the analog-to-digital converter 200 according to the second embodiment. The analog-to-digital converter 200 according to the second embodiment differs from that of the first embodiment in that the resistors 211 and 212 are not included and a positive-side selection unit 280 and a negative-side selection unit 290 are included instead of the selection unit 260. In addition, the mode control unit 270 according to the second embodiment does not supply the mode signal MODE to the sampling clock supply unit 130.

In addition, a positive-side input voltage $V_{inp}$ in a differential signal is input to the sampling switch 221 according to the second embodiment. A negative-side input voltage $V_{inn}$ within the differential signal is input to the sampling switch 222.

The positive-side selection unit 280 selects one of a positive-side threshold $D_{thp}$ and a positive-side control signal DACp in accordance with the mode signal MODE. The positive-side selection unit 280 selects the positive-side threshold $D_{thp}$ in the voltage range determination mode and selects the positive-side control signal DACp in the AD conversion mode. Then, the positive-side selection unit 280 supplies the selected signal as a positive-side selection signal SELp to the digital-to-analog conversion unit 230.

The negative-side selection unit 290 selects one of a negative-side threshold $D_{thn}$ and a negative-side control signal DACn in accordance with the mode signal MODE. The negative-side selection unit 290 selects the negative-side threshold $D_{thn}$ in the voltage range determination mode and selects the negative-side control signal DACn in the AD conversion mode. Then, the negative-side selection unit 290 supplies the selected signal as a negative-side selection signal SELn to the digital-to-analog conversion unit 230.

FIG. 24 is a diagram illustrating an example of an operation of the sampling switch control unit 223 according to the second embodiment. In the second embodiment, the sampling clock supply unit 130 does not stop supplying the sampling clock even in the voltage range determination mode. Therefore, even in the voltage range determination mode, the sampling switch control unit 223 according to the second embodiment turns both the sampling switches 221 and 222 on when the sampling clock $CLK_{SMP}$ is at the high level. The control in the AD conversion mode is the same as that of the first embodiment.

Figure 25:
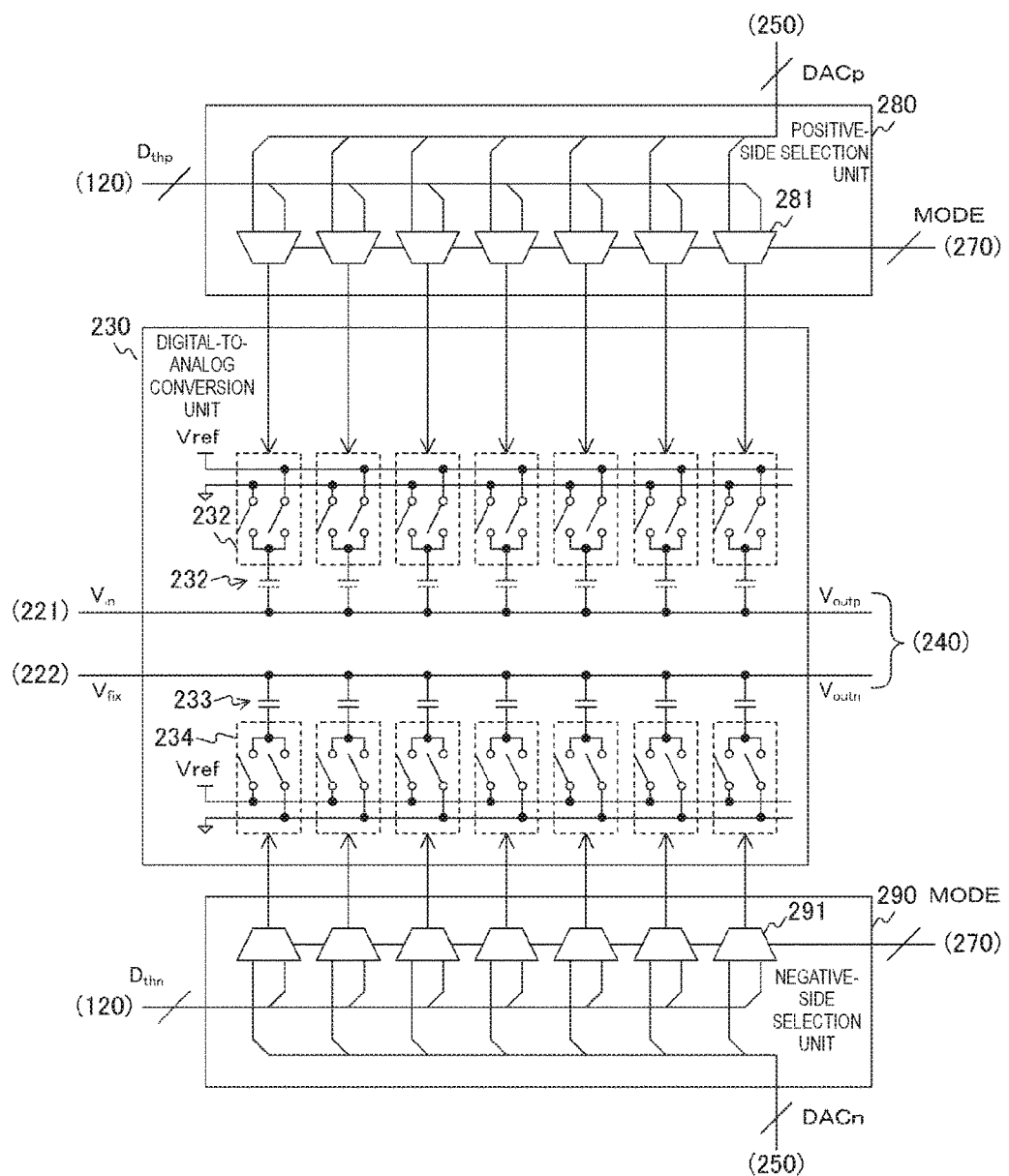
FIG. 25 is a circuit diagram illustrating configuration examples of a digital-to-analog conversion unit, a positive-side selection unit, and a negative-side selection unit according to the second embodiment of the present technology.

FIG. 25 is a circuit diagram illustrating configuration examples of the digital-to-analog conversion unit 230, the positive-side selection unit 280, and the negative-side selection unit 290 according to the second embodiment. The positive-side selection unit 280 includes N positive-side selectors 281 and the negative-side selection unit 290 includes N negative-side selectors 291. The positive-side selector 281 selects one of a bit corresponding to the positive-side threshold $D_{thp}$ and a bit corresponding to the positive-side control signal DACp in accordance with the mode signal MODE. The negative-side selector 291 selects one of a bit corresponding to the negative-side threshold $D_{thn}$ and a bit corresponding to the negative-side control signal DACn in accordance with the mode signal MODE.

Note that the configurations of the above-described first to fourth modification examples may be applied to the analog-to-digital converter 200 according to the second embodiment.

In this way, according to the second embodiment of the present technology, the analog-to-digital converter 200 performs the AD conversion when the differential signal is within the setting range. Therefore, even in a case in which the sensor or the signal transmission standard does not correspond to the single end signal, it is possible to reduce power consumption.

<3. Third Embodiment>

In the above-described first embodiment, the analog-to-digital converter 200 has updated the control signals (DACp and DACn) used to control the digital-to-analog conversion unit 230 without using an external clock signal. The analog-to-digital converter 200 is generally called a self-synchronized converter. On the other hand, an analog-to-digital converter updating a control signal used to control the digital-to-analog conversion unit 230 in synchronization with an external clock signal is called an external synchronized converter. The analog-to-digital converter 200 according to the third embodiment differs from that of the first embodiment in that the analog-to-digital converter 200 is of an external synchronized type.

Figure 26:
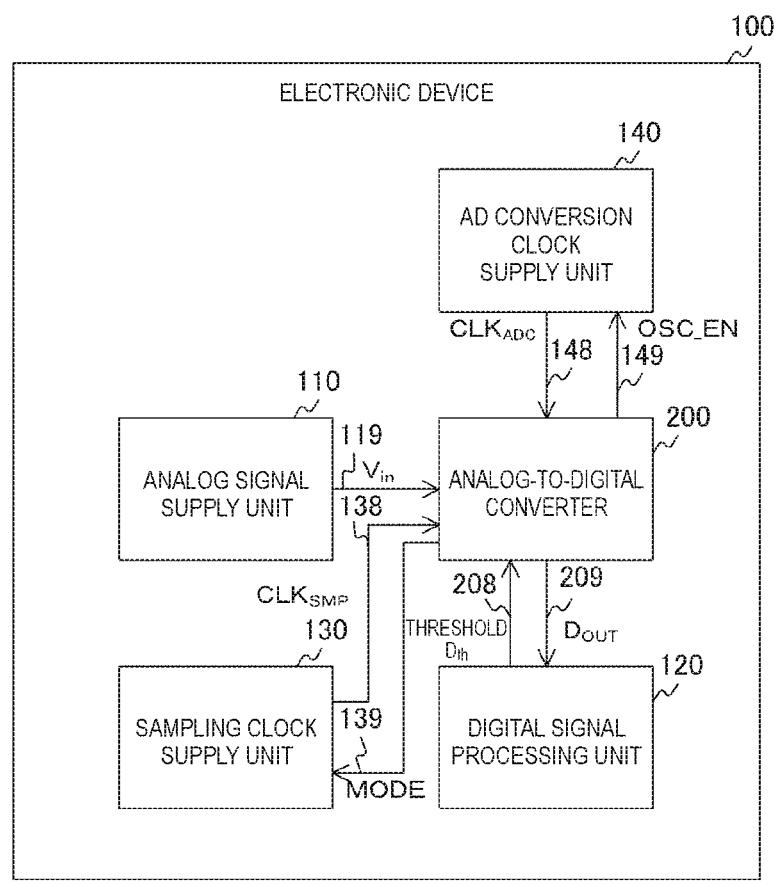
FIG. 26 is a block diagram illustrating a configuration example of an electronic device according to a third embodiment of the present technology.

FIG. 26 is a block diagram illustrating a configuration example of the electronic device 100 according to the third embodiment. The electronic device 100 according to the third embodiment differs from that of the first embodiment in that an AD conversion clock supply unit 140 is further included.

The AD conversion clock supply unit 140 generates a periodic signal with a higher frequency than the sampling clock $CLK_{SMP}$ as an AD conversion clock $CLK_{ADC}$. The AD conversion clock supply unit 140 supplies the generated AD conversion clock $CLK_{ADC}$ to the analog-to-digital converter 200 via a signal line 148. In addition, the AD conversion clock supply unit 140 receives an enable signal OSC_EN from the analog-to-digital converter 200 via a signal line 149. When the enable signal OSC_EN is set to be enabled, the AD conversion clock supply unit 140 starts generation of the AD conversion clock $CLK_{ADC}$. When the enable signal OSC_EN is set to be disabled, the AD conversion clock supply unit 140 stops generating the AD conversion clock $CLK_{ADC}$. In an initial state, the enable signal OSC_EN is set to be disabled, for example.

Figure 27:
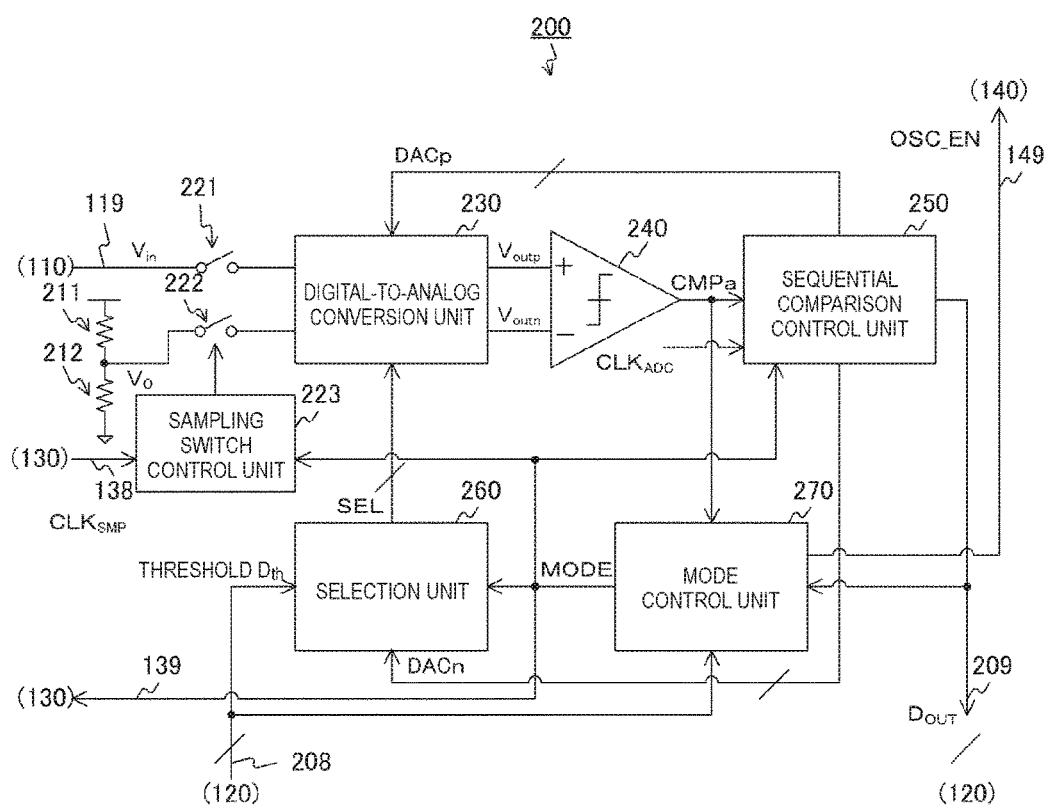
FIG. 27 is a block diagram illustrating a configuration example of an analog-to-digital converter according to the third embodiment of the present technology.

FIG. 27 is a block diagram illustrating a configuration example of the analog-to-digital converter 200 according to the third embodiment. The sequential comparison control unit 250 according to the third embodiment updates the positive-side control signal DACp or the negative-side control signal DACn in synchronization with the AD conversion clock $CLK_{ADC}$ in the AD conversion mode.

FIG. 28 is a diagram illustrating an example of an operation of the mode transition unit 271 according to the third embodiment. In a case in which the comparison result CMPa indicates that the input voltage $V_{in}$ is greater than the threshold $D_{th}$ in the voltage range determination mode, the mode transition unit 271 sets the enable signal OSC_EN to be enabled (for example, "1"). Then, the mode transition unit 271 transitions the mode signal MODE to the voltage range determination mode ("1") after a given period passes. In the given period, a time taken until an output of the AD conversion clock $CLK_{ADC}$ is stabilized is set.

On the other hand, in a case in which the comparison result CMPd indicates that the input voltage $V_{in}$ is equal to or less than the threshold $D_{th}$ in the AD conversion mode, the mode transition unit 271 sets the enable signal OSC_EN to be disabled (for example, "0"). In addition, the mode transition unit 271 transitions the mode signal MODE to the voltage range determination mode ("0").

FIG. 29 is a timing chart illustrating an example of an operation of the analog-to-digital converter according to the third embodiment.

When it is determined at time T31 that the analog signal is within the setting range, the analog-to-digital converter 200 sets the enable signal OSC_EN to be enabled and starts oscillating the AD conversion clock $CLK_{ADC}$.

A time T32 at which a given period has passed from time T31, an output of the AD conversion clock $CLK_{ADC}$ becomes stable. At time T32, the analog-to-digital converter 200 transitions the mode to the AD conversion mode. In the AD conversion mode, the analog-to-digital converter 200 samples the analog signal in synchronization with the sampling clock $CLK_{SMP}$ and performs the AD conversion using the AD conversion clock $CLK_{ADC}$.

Figure 30:
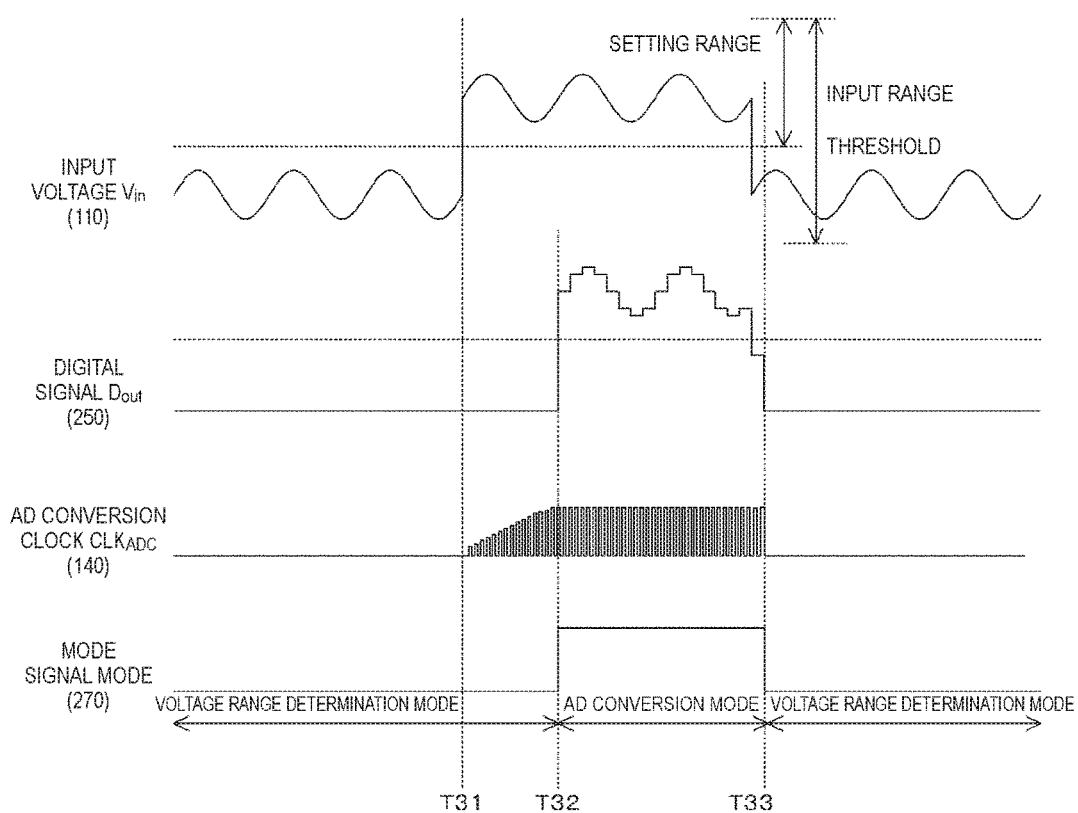
FIG. 30 is a timing chart illustrating examples of variations in an input voltage, a digital signal, an AD conversion clock, and a mode signal according to the third embodiment of the present technology.

FIG. 30 is a timing chart illustrating examples of variations in the input voltage, the digital signal, the AD conversion clock, and the mode signal according to the third embodiment.

When the input voltage $V_{in}$ is greater than the threshold immediately before time T31, the mode control unit 270 controls the AD conversion clock supply unit 140 at time T31 such that the supply of the AD conversion clock $CLK_{ADC}$ is started.

At time T32 at which the AD conversion clock $CLK_{ADC}$ becomes stable, the mode control unit 270 sets a high level in the mode signal MODE. In addition, the comparator 240 and the sequential comparison control unit 250 perform the AD conversion using the AD conversion clock $CLK_{ADC}$.

Then, when the input voltage $V_{in}$ is equal to or less than the threshold immediately before time T33, the mode control unit 270 sets a low level in the mode signal MODE at time T33 and causes the supply of the AD conversion clock $CLK_{ADC}$ to be stopped.

Note that the configurations of the above-described first to fourth modification examples or the second embodiment may be applied to the analog-to-digital converter 200 according to the third embodiment.

In this way, according to the third embodiment of the present technology, the analog-to-digital converter 200 stops the AD conversion clock when the input voltage is outside of the setting range. Therefore, it is possible to reduce power consumption of the electronic device 100 in which the external synchronized analog-to-digital converter 200.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a compact disc (CD), a minidisc (MD), and a digital versatile disc (DVD), a memory card, and a Blu-ray disc (registered trademark) can be used.

Note that the effects described in the present specification are not necessarily limited, and any effect described in the present disclosure may be exhibited.

Additionally, the present technology may also be configured as below.

(1)

An analog-to-digital converter including:

a comparator configured to generate a comparison result by comparing an analog signal to a threshold indicating a boundary of a predetermined range in a determination mode and convert the analog signal into a digital signal in a conversion mode; and a mode control unit configured to transition the determination mode to the conversion mode in a case in which the comparison result indicating that the analog signal is not within the predetermined range is generated.

(2)

The analog-to-digital converter according to (1), including:

a digital-to-analog conversion unit configured to generate a positive-side output signal and a negative-side output signal from the analog signal and a predetermined selection signal and output the positive-side output signal and the negative-side output signal to the comparator;

a sequential comparison control unit configured to generate a predetermined control signal on a basis of the digital signal in the conversion mode; and a selection unit configured to select the predetermined threshold and supply the predetermined threshold as the predetermined selection signal to the digital-to-analog conversion unit in the conversion mode and to select the predetermined control signal and supply the predetermined control signal as the predetermined selection signal to the digital-to-analog conversion unit in the determination mode, in which the comparator compares the positive-side output signal to the negative-side output signal.

(3)

The analog-to-digital converter according to (2), in which the analog signal is a differential signal, the predetermined control signal includes a positive-side control signal and a negative-side control signal, the threshold includes a positive-side threshold and a negative-side threshold, and the selection unit includes a positive-side selection unit configured to select the positive-side threshold in the conversion mode and select the positive-side control signal in the determination mode, and a negative-side selection unit configured to select the negative-side threshold in the conversion mode and select the negative-side control signal in the determination mode.

(4)

The analog-to-digital converter according to (2), in which the analog signal is a single end signal, the predetermined control signal includes a positive-side control signal and a negative-side control signal, the selection unit supplies one of the positive-side control signal and the negative-side control signal as the selection signal in the conversion mode, and the digital-to-analog conversion unit generates the positive-side output signal and the negative-side output signal from the analog signal, the predetermined selection signal, and the other of the positive-side control signal and the negative-side control signal.

(5)

The analog-to-digital converter according to any one of (2) to (4), in which the threshold includes an upper limit and a lower limit of the predetermined range, and the selection unit selects the upper limit and the lower limit in order in the determination mode.

(6)

The analog-to-digital converter according to any one of (2) to (5), in which the comparison control unit generates the predetermined control signal in synchronization with a predetermined conversion clock signal from a conversion clock supply unit, and the determination unit controls the conversion clock supply unit in the determination mode such that generation of the predetermined conversion clock is started, and then transitions the determination mode to the conversion mode.

(7)

The analog-to-digital converter according to any one of (1) to (6), in which the mode control unit determines whether the digital signal is within the predetermined range in the conversion mode and transitions the conversion mode to the determination mode in a case in which the digital signal is not within the predetermined range.

(8)

The analog-to-digital converter according to any one of (1) to (6), in which the mode control unit counts a number of times the analog signal is converted into the digital signal in the conversion mode and transitions the conversion mode to the determination mode in a case in which a count value is greater than a predetermined value.

(9)

An electronic device including:

a sampling switch configured to sample an analog signal;

a comparator configured to generate a comparison result by comparing the analog signal to a threshold indicating a boundary of the predetermined range in a determination mode and convert the sampled analog signal into a digital signal in a conversion mode; and a mode control unit configured to transition the determination mode to the conversion mode in a case in which the comparison result indicating that the analog signal is not within the predetermined range is generated.

(10)

The electronic device according to (9), further including:

a clock signal supply unit configured to supply a clock signal, in which at least one of the sampling switch and the comparator operates in synchronization with the clock signal, and the mode control unit controls the clock signal supply unit in the determination mode such that the supply of the clock signal is stopped.

(11)

The electronic device according to (10), in which the clock signal includes a sampling clock signal, the sampling switch samples the analog signal in synchronization with the sampling clock signal, and the mode control unit causes the supply of the sampling clock signal to be stopped in the determination mode.

(12)

The electronic device according to (10) or (11), in which the clock signal includes an AD conversion clock signal, the comparator converts the analog signal into the digital signal in synchronization with the AD conversion clock signal, and the mode control unit causes the supply of the AD conversion clock signal to be stopped when transitioning the conversion mode to the determination mode.

(13)

The electronic device according to (12), in which the mode control unit causes the supply of the AD conversion clock signal to be started earlier by a predetermined time than when transitioning the determination mode to the conversion mode.

(14)

A method of controlling an analog-to-digital converter, the method including:

a comparison procedure of generating a comparison result by comparing an analog signal to a threshold indicating a boundary of the predetermined range in a determination mode and converting the analog signal into a digital signal in a conversion mode; and a mode control procedure of transitioning the determination mode to the conversion mode in a case in which the comparison result indicating that the analog signal is not within the predetermined range is generated.

REFERENCE SIGNS LIST 100 electronic device
110 analog signal supply unit
120 digital signal processing unit
130 sampling clock supply unit
140 AD conversion clock supply unit
200 analog-to-digital converter
211, 212 resistor
221, 222 sampling switch
223 sampling switch control unit
230 digital-to-analog conversion unit
231 positive-side switch
232 positive-side capacitor
233 negative-side capacitor
234 negative-side switch
240 comparator
250 sequential comparison control unit
260 selection unit
261 selector
270 mode control unit
271 mode transition unit
272 threshold comparison unit
273 counter
280 positive-side selection unit
281 positive-side selector
290 negative-side selection unit
291 negative-side selector

The invention claimed is:

1. An analog-to-digital converter, comprising:
   a comparator configured to:
   compare an analog signal with a threshold in a determination mode;
   generate a comparison result based on the comparison of the analog signal with the threshold in the determination mode,
   wherein the threshold indicates a boundary of a determined range; and
   convert the analog signal into a digital signal in a conversion mode; and
   a mode control unit configured to transition the determination mode to the conversion mode based on the comparison result that indicates the analog signal is outside the determined range.

2. The analog-to-digital converter according to claim 1, further comprising:
   a digital-to-analog conversion unit configured to:
   generate a positive-side output signal and a negative-side output signal from the analog signal and a selection signal; and
   output the positive-side output signal and the negative-side output signal to the comparator,
   wherein the comparator is further configured to compare the positive-side output signal to the negative-side output signal;
   a sequential comparison control unit configured to generate a control signal based on the digital signal in the conversion mode; and
   a selection unit configured to:
   select the threshold;
   supply the selected threshold as the selection signal to the digital-to-analog conversion unit in the conversion mode;
   select the control signal; and
   supply the selected control signal as the selection signal to the digital-to-analog conversion unit in the determination mode.

3. The analog-to-digital converter according to claim 2, wherein
   the analog signal is a differential signal,
   the control signal includes a positive-side control signal and a negative-side control signal,
   the threshold includes a positive-side threshold and a negative-side threshold, and
   the selection unit includes:
   a positive-side selection unit configured to:
   select the positive-side threshold in the conversion mode; and
   select the positive-side control signal in the determination mode; and
   a negative-side selection unit configured to:
   select the negative-side threshold in the conversion mode; and select the negative-side control signal in the determination mode.

4. The analog-to-digital converter according to claim 2, wherein
the analog signal is a single end analog signal,
the control signal includes a positive-side control signal and a negative-side control signal,
the selection unit is further configured to supply one of the positive-side control signal or the negative-side control signal as the selection signal in the conversion mode, and
the digital-to-analog conversion unit is further configured to generate the positive-side output signal and the negative-side output signal from the single end analog signal, the selection signal, and other of the positive-side control signal and the negative-side-control signal.

5. The analog-to-digital converter according to claim 2, wherein
the threshold includes an upper limit and a lower limit of the determined range, and
the selection unit is further configured to select the upper limit and the lower limit in order in the determination mode.

6. The analog-to-digital converter according to claim 2, further comprising a conversion clock supply unit configured to generate a conversion clock signal, wherein
the sequential comparison control unit is further configured to generate the control signal in synchronization with the conversion clock signal from the conversion clock supply unit, and
the mode control unit is further configured to:
control the conversion clock supply unit in the determination mode such that generation of the conversion clock signal is started; and
transition the determination mode to the conversion mode based on the generation of the conversion clock signal.

7. The analog-to-digital converter according to claim 1, wherein the mode control unit is further configured to:
determine whether the digital signal is within the determined range in the conversion mode; and
transition the conversion mode to the determination mode based on the digital signal that is outside the determined range.

8. The analog-to-digital converter according to claim 1, wherein the mode control unit is further configured to:
count a number of times the analog signal is converted into the digital signal in the conversion mode; and
transition the conversion mode to the determination mode based on a count value of the count that is greater than a determined value.

9. An electronic device, comprising:
a sampling switch configured to sample an analog signal;
a comparator configured to:
compare the analog signal with a threshold in a determination mode;
generate a comparison result based on the comparison of the analog signal with the threshold in the determination mode,
wherein the threshold indicates a boundary of a determined range; and
convert the sampled analog signal into a digital signal in a conversion mode; and
a mode control unit configured to transition the determination mode to the conversion mode based on the comparison result that indicates the analog signal is outside the determined range.

10. The electronic device according to claim 9, further comprising a clock signal supply unit configured to supply a clock signal, wherein
at least one of the sampling switch or the comparator operates in synchronization with the clock signal, and
the mode control unit is further configured to control the clock signal supply unit in the determination mode such that the supply of the clock signal is stopped.

11. The electronic device according to claim 10, wherein
the clock signal includes a sampling clock signal,
the sampling switch is further configured to sample the analog signal in synchronization with the sampling clock signal, and
the mode control unit is further configured to stop the supply of the sampling clock signal in the determination mode.

12. The electronic device according to claim 10, wherein
the clock signal includes an AD conversion clock signal,
the comparator is further configured to convert the analog signal into the digital signal in synchronization with the AD conversion clock signal, and
the mode control unit is further configured to stop the supply of the AD conversion clock signal at a time of transition of the conversion mode to the determination mode.

13. The electronic device according to claim 12, wherein the mode control unit is further configured to start the supply of the AD conversion clock signal earlier than a time of the transition of the determination mode to the conversion mode.

14. A method of controlling an analog-to-digital converter, the method comprising:
comparing an analog signal with a threshold in a determination mode;
generating a comparison result based on the comparison of the analog signal with the threshold in the determination mode, wherein the threshold indicates a boundary of a determined range;
transitioning the determination mode to a conversion mode based on the comparison result that indicates the analog signal is outside the determined range; and
converting the analog signal into a digital signal in the conversion mode.

15. An analog-to-digital converter, comprising:
a comparator configured to:
generate a comparison result based on a comparison of an analog signal with a threshold in a determination mode, wherein the threshold indicates a boundary of a determined range; and
convert the analog signal into a digital signal in a conversion mode;
a mode control unit configured to transition the determination mode to the conversion mode based on the comparison result that indicates the analog signal is outside the determined range;
a digital-to-analog conversion unit configured to:
generate a positive-side output signal and a negative-side output signal from the analog signal and a selection signal, and
output the positive-side output signal and the negative-side output signal to the comparator;
a sequential comparison control unit configured to generate a control signal based on the digital signal in the conversion mode, wherein
the analog signal is a differential signal,
the control signal includes a positive-side control signal and a negative-side control signal, the threshold includes a positive-side threshold and a negative-side threshold; and a selection unit that includes:
  a positive-side selection unit configured to:
    select the positive-side threshold in the conversion mode; and
    select the positive-side control signal in the determination mode; and
  a negative-side selection unit configured to:
    select the negative-side threshold in the conversion mode; and
    select the negative-side control signal in the determination mode.

16. An analog-to-digital converter, comprising:
a comparator configured to:
  generate a comparison result based on a comparison of an analog signal with a threshold in a determination mode, wherein the threshold indicates a boundary of a determined range; and
  convert the analog signal into a digital signal in a conversion mode; and
a mode control unit configured to:
  transition the determination mode to the conversion mode based on the comparison result that indicates the analog signal is outside the determined range;
  determine the digital signal is within the determined range in the conversion mode; and
  transition the conversion mode to the determination mode based on the digital signal that is outside the determined range.

* * * * *